United States Patent
Sugawara et al.

(10) Patent No.: US 8,091,761 B2
(45) Date of Patent: Jan. 10, 2012

(54) BONDING APPARATUS AND BONDING METHOD

(75) Inventors: Kenji Sugawara, Musashimurayama (JP); Yong Ghen, Suzhou (CN)

(73) Assignee: Shinkawa Ltd., Tokyo (JP)

(*) Notice: Subject to any disclaimer, the term of this patent is extended or adjusted under 35 U.S.C. 154(b) by 0 days.

(21) Appl. No.: 12/924,607

(22) Filed: Sep. 30, 2010

(65) Prior Publication Data

US 2011/0114704 A1 May 19, 2011

Related U.S. Application Data

(63) Continuation of application No. PCT/JP2008/068247, filed on Oct. 7, 2008.

(30) Foreign Application Priority Data

Mar. 31, 2008 (JP) .................................. 2008-090383

(51) Int. Cl.
*B23K 31/02* (2006.01)
*B23K 37/00* (2006.01)

(52) U.S. Cl. ............. 228/102; 228/4.5; 228/8; 228/105; 228/180.5

(58) Field of Classification Search .................... None
See application file for complete search history.

(56) References Cited

U.S. PATENT DOCUMENTS

| | | | | | |
|---|---|---|---|---|---|
| 5,579,984 A | * | 12/1996 | Sasano | ............. | 228/102 |
| 5,583,756 A | * | 12/1996 | Sasano | ............. | 700/59 |
| 5,615,821 A | * | 4/1997 | Sasano | ............. | 228/102 |
| 5,720,424 A | * | 2/1998 | Takeuchi | ............. | 228/4.5 |
| 5,870,489 A | * | 2/1999 | Yamazaki et al. | ............. | 382/151 |
| 6,762,848 B2 | * | 7/2004 | Hayata et al. | ............. | 356/614 |
| 7,899,239 B2 | * | 3/2011 | Nishimaki et al. | ............. | 382/145 |
| 2001/0016786 A1 | * | 8/2001 | Takahashi et al. | ............. | 700/195 |
| 2002/0008131 A1 | * | 1/2002 | Hess et al. | ............. | 228/105 |
| 2002/0104870 A1 | * | 8/2002 | Nogawa | ............. | 228/4.5 |
| 2002/0166885 A1 | * | 11/2002 | Sugawara | ............. | 228/103 |
| 2005/0167471 A1 | * | 8/2005 | Enokido et al. | ............. | 228/103 |
| 2005/0284914 A1 | * | 12/2005 | Beatson et al. | ............. | 228/4.5 |
| 2006/0054662 A1 | * | 3/2006 | Nishimaki et al. | ............. | 228/103 |
| 2008/0054052 A1 | * | 3/2008 | Arakawa | ............. | 228/244 |
| 2010/0072262 A1 | * | 3/2010 | Sugawara et al. | ............. | 228/102 |
| 2010/0301101 A1 | * | 12/2010 | Seyama et al. | ............. | 228/105 |

FOREIGN PATENT DOCUMENTS

| | | | |
|---|---|---|---|
| JP | 01-161727 A | * | 6/1989 |
| JP | H01-142407 A | | 6/1989 |
| JP | H04-250347 A | | 9/1992 |
| JP | H05-206197 A | | 8/1993 |
| JP | H07-297220 A | | 11/1995 |
| JP | H08-31863 A | | 2/1996 |
| JP | 2001-118880 A | | 4/2001 |
| JP | 2001-223238 A | | 8/2001 |
| JP | 2007-67197 A | | 3/2007 |
| JP | 2008-252080 A | | 10/2008 |

* cited by examiner

*Primary Examiner* — Kiley Stoner
(74) *Attorney, Agent, or Firm* — DLA Piper LLP (US)

(57) ABSTRACT

A bonding apparatus provided with a control unit capable of controlling the position of the central axis of a bonding tool in the X direction and the Y direction based on an image of a pad acquired with a camera and an offset amount, the apparatus including: an outline obtaining unit for obtaining each of the sides of the pad and an outline of a pressure-bonded ball by processing the image acquired with the camera; a gap length obtaining unit for obtaining gap lengths between the respective sides of the pad and the outline of the pressure-bonded ball; and an offset correcting unit for correcting the offset amount based on the gap lengths obtained by the gap obtaining unit.

14 Claims, 13 Drawing Sheets

BONDING APPARATUS AND BONDING METHOD

The present application is a Continuation application filed based upon PCT International Application No. PCT/JP2008/068247 of Oct. 7, 2008.

BACKGROUND OF THE INVENTION

1. Field of the Invention

The present invention relates to a structure of a bonding apparatus and to a bonding method used for the bonding apparatus.

2. Description of Related Art

Wire-bonding apparatuses that connect between a pad as an electrode of a semiconductor chip and a lead as an electrode of a lead frame a wire as a thin metal wire are widely used in manufacturing semiconductor devices. In many cases, such wire-bonding apparatuses employ a method of sequentially bonding between a pad and a lead with a wire by inserting the wire through a capillary, forming a tip end of the wire that extends out from the tip of the capillary into an initial ball by, for example, sparking, moving the capillary down toward the pad, forming a pressure-bonded ball by pressure-bonding the initial ball to the pad using the capillary tip, moving the capillary upward, looping the wire from the pressure-bonded ball toward the lead while feeding out the wire from the capillary tip, moving the capillary down toward the lead, pressure-bonding the wire to the lead using the capillary tip, cutting the wire by moving the capillary upward, and then moving the capillary to a position of a pad to be processed next.

When carrying out wire-bonding in this manner, it is required to adjust the position of the capillary tip with the position of a pad or a lead to be bonded. According to a positioning method that is commonly used, the position of a pad or a lead is obtained by taking an image of a semiconductor chip or a lead frame using, for example, a camera, and measuring the distance by counting the number of pixels in the image between the position of the pad or the lead and the optical axis of the camera located at the center of the field of view.

When using this method, if the optical axis of the camera is disposed coaxially with the central axis of the capillary, the distance between the optical axis of the camera and the pad or the lead directly corresponds to the distance between the central axis of the capillary and the pad or the lead. Therefore, it is possible to carry out bonding with the position of the capillary tip being adjusted with the position of the pad or the lead by moving the capillary tip only by this distance. However, providing the optical axis of the camera coaxially with the central axis of the capillary causes the field of view to be blocked with the capillary and a bonding arm, and thus it is not possible to focus on the pad or the lead to be bonded. Therefore, the optical axis of the camera is provided at a position offset from the central axis of the capillary. Accordingly, positioning the capillary tip at the position of the pad or the lead based on the image acquired with the camera requires movement of the capillary tip by a distance including the distance between the optical axis of the camera and the pad or the lead as well as an offset amount.

A wire-bonding apparatus typically includes an X motor and a Y motor provided for an X-Y table and driving a bonding head, to which, for example, a capillary and a camera are attached respectively, in the X direction and the Y direction, and further includes a Z motor for driving a bonding arm to which the capillary is attached at its tip in the Z direction, and a source of heat generation such as a heat block for heating the lead frame. Accordingly, a temperature change of the wire-bonding apparatus resulting from the source of heat generation can often cause variations in relative positions between the central axis of the capillary and the optical axis of the camera, and error due to such variations appears as a displacement of the bonding position, or a displacement of the position of a pressure-bonded ball with respect to the pad.

Japanese Unexamined Patent Application Publication No. H07-297220, for example, proposes a method of moving the optical axis of a camera above the central position of a pressure-bonded ball that has been bonded, and correcting an offset amount based on the travel distance and the offset at this time. Further, Japanese Unexamined Patent Application Publication No. H08-31863, for example, proposes a method of, when bonding, detecting edges of a pressure-bonded ball based on three directions of lines respectively connecting the center of a pad that has been previously known and indicates the portion for wire binding and points within the pad and outside the pressure-bonded ball, calculating the central position of the pressure-bonded ball based on the three edges of the pressure-bonded ball, and correcting an offset amount based on the amount of displacement between the central position of the pad and the central position of the pressure-bonded ball. Japanese Unexamined Patent Application Publication No. H08-31863 alternatively proposes a method, as a method of detecting the central coordinate of a pressure-bonded ball, of setting an assumed ball center, detecting edges of the pressure-bonded ball for total eight directions including an X direction, a Y direction, and directions tilted 45 degrees respectively from the X direction and the Y direction in both negative and positive sides taking the assumed ball center as a reference point, dividing the directions into four groups and drawing perpendicular lines from respective central coordinates, and acquiring the central position of the pressure-bonded ball based on a coordinate of an intersection point of these lines.

Further, the size of pressure-bonded ball changes depending on, for example, the heating temperature of the heat block. A pressure-bonded ball smaller than a designed value can often result in poor bonding, and a pressure-bonded ball larger than the designed value can often cause the pressure-bonded ball to protrude from the pad. Accordingly, during bonding, it is required to detect the size of the pressure-bonded ball and confirm that the pressure-bonded ball is bonded at a designed size. Therefore, Japanese Unexamined Patent Application Publication No. H08-31863 proposes a method of acquiring the size of a pressure-bonded ball in the same manner when the central position of the pressure-bonded ball is acquired.

As the size of pads has increasingly become smaller along with fine-pitching of devices in recent years, there are manufactured semiconductor devices in which the diameter of a wire that extends from the pad is substantially the same as that of a pressure-bonded ball. When acquiring the image, using a camera, of a pressure-bonded ball that has been pressure-bonded to a pad of such a semiconductor chip, almost a half of the circumference of the outer shape of the pressure-bonded ball is hidden under the wire that extends from the pressure-bonded ball, and it is not possible to detect its edge by image processing. According to the alternative method disclosed in Japanese Unexamined Patent Application Publication No. H08-31863, it is difficult to acquire the central position of the pressure-bonded ball when there is more than one edge of the pressure-bonded ball that cannot be detected as being covered under the wire. Likewise, it is also difficult to acquire the size of the pressure-bonded ball.

According to the method of calculating the central position and the size of the pressure-bonded ball based on the central position of the pad and the three edges of the pressure-bonded ball as proposed by Japanese Unexamined Patent Application Publication No. H08-31863, it is often not possible to detect the coordinates of the edges as the intersection points respectively of an X axis and a Y axis that pass the center of the pad and the edges of the pressure-bonded ball are covered with the wire depending on the position of the pad and the position of the pressure-bonded ball. Therefore, the methods of correcting the offset amount and detecting the size of the pressure-bonded ball respectively disclosed by Japanese Unexamined Patent Application Publication No. H07-297220 and Japanese Unexamined Patent Application Publication No. H08-31863 cannot be applied to bonding for fine-pitch semiconductor chips in which the diameter of the pressure-bonded ball is substantially the same as that of the wire.

BRIEF SUMMARY OF THE INVENTION

An object of the present invention is to improve the bonding accuracy of bonding apparatuses by effectively correcting an offset amount even when carrying out bonding for fine-pitch semiconductor chips. Another object of the present invention is to improve the stability of bonding quality by confirming the size of a pressure-bonded ball during bonding.

A bonding apparatus according to the present invention includes:

a bonding head movable in an X direction and a Y direction with an X-Y table;

a bonding arm for moving a bonding tool in an approaching and retreating direction with respect to a pad of a semiconductor chip, the bonding arm being attached to the bonding head and having the bonding tool attached to a tip thereof;

a camera for capturing an image of the pad and a bonded ball bonded to the pad, the camera being attached to the bonding head with an optical axis of the camera being offset by a predetermined distance in the X direction and the Y direction with respect to the center line of the bonding tool in bonding operation; and a control unit for controlling the position of the central axis of the bonding tool in the X direction and the Y direction based on an offset amount of the bonding head and the image of the pad captured with the camera, and the control unit comprises:

an outline obtaining means for obtaining each of the sides of the pad in a quadrilateral shape and an outline of the bonded ball by processing the image captured with the camera;

a gap length obtaining means for obtaining each gap length between each of the sides of the pad and each portion of the outline of the bonded ball closest to the corresponding sides of the pad; and an offset correcting means for correcting the offset amount based on each gap length obtained by the gap length obtaining means.

It is preferable in the bonding apparatus according to the present invention that the outline obtaining means obtains each of sides of at least one pad in a quadrilateral shape and an outline of a bonded ball bonded to the at least one pad, the gap length obtaining means obtains:

each distance in the Y direction, serving as each Y direction gap length, between each of the sides extending in the X direction of the at least one pad and each portion of the outline of the bonded ball closest to the corresponding sides extending in the X direction; and each distance in the X direction, serving as each X direction gap length, between each of the sides extending in the Y direction of the at least one pad and a each portion of the outline of the bonded ball closest to the corresponding sides extending in the Y direction, and the offset correcting means:

compares each X direction gap length and each Y direction gap length respectively with tolerable ranges previously set to determine whether or not each X direction gap length and each Y direction gap length fall within the tolerable ranges;

changes, when at least one of each X direction gap length is outside the tolerable range, an offset amount in the X direction according to the difference between each X direction gap length and a median value of the tolerable range; and changes, when at least one of each Y direction gap length is outside the tolerable range, an offset amount in the Y direction according to the difference between each Y direction gap length and a median value of the tolerable range.

It is also preferable in the bonding apparatus according to the present invention that the outline obtaining means obtains each of the sides of a plurality of pads in a quadrilateral shape and an outline of a bonded ball bonded to each of the pads, the plurality of pads having an identical designed gap length, and the offset correcting means changes the offset amount in the X direction according to the difference between an average value of each X direction gap length and the median value of the tolerable range, and changes the offset amount in the Y direction according to the difference between an average value of each Y direction gap length and the median value of the tolerable range.

In the above-described structure, it is preferable that the gap length obtaining means obtains one X direction gap length and one Y direction gap length for each pad.

It is also preferable in the bonding apparatus according to the present invention that the gap length obtaining means obtains one X direction gap length and one Y direction gap length for each pad, and that the X direction gap length and the Y direction gap length are the distance in the X direction and the distance in the Y direction respectively between two adjacent sides and portions of the outline of the bonded ball closest to the corresponding sides.

It is also preferable in the bonding apparatus according to the present invention that the gap length obtaining means obtains:

each X direction gap length based on a distance in the X direction between each of the sides of the plurality of pads being in a quadrilateral shape included in a first group and having an identical designed gap length in the X direction, and each portion of the outline of each bonded ball closest to the corresponding sides extending in the Y direction, each of the bonded balls being bonded to each of the pads; and each Y direction gap length based on a distance in the Y direction between each of the sides of the plurality of pads being in a quadrilateral shape included in a second group and having an identical designed gap length in the Y direction, and each portion of the outline of each bonded ball closest to the corresponding sides extending in the X direction, each of the bonded balls being bonded to each of the pads.

It is also preferable that the bonding apparatus according to the present invention further includes:
an bonded ball diameter calculating means for calculating the diameter of the bonded ball based on each gap length obtained by the gap length obtaining means and the width of the pad; and
a display unit for displaying the diameter of the bonded ball that is calculated.

It is also preferable in the bonding apparatus according to the present invention that
the outline obtaining means obtains each of the sides of a plurality of pads in a quadrilateral shape and an outline of a bonded ball bonded to each of the pads, the plurality of pads having an identical pad width and an identical designed gap length,
the gap length obtaining means obtains:
each distance in the Y direction, serving as each Y direction gap length, between each of the sides extending in the X direction of each of the pads and each portion of the outline of the bonded ball closest to the corresponding sides extending in the X direction; and
each distance in the X direction, serving as each X direction gap length, between each of the sides extending in the Y direction of each of the pads and each portion of the outline of the bonded ball closest to the corresponding sides extending in the Y direction, and
the bonded ball diameter calculating means calculates the diameter of the bonded ball by subtracting a value twice as large as an average value of one or both of the gap lengths in the X direction and in the Y direction from the pad width.

Alternatively, it is also preferable that
the outline obtaining means obtains each of sides of a plurality of pads in a quadrilateral shape and an outline of a bonded ball bonded to each of the pads, the plurality of pads having an identical pad width and an identical designed gap length,
the gap length obtaining means obtains:
the distance in the pad width direction between each of the sides on a positive side with respect to the pad width direction and extending perpendicularly to the pad width direction and each portion of the outline of the bonded ball closest to the corresponding side as a positive pad width direction gap length; and
the distance in the pad width direction between each of the sides on a negative side with respect to the pad width direction and extending perpendicularly to the pad width direction and each portion of the outline of the bonded ball closest to the corresponding side as a negative pad width direction gap length, and
the bonded ball diameter calculating means calculates the diameter of the bonded ball by subtracting an average value of the positive pad width direction gap lengths and an average value of the negative pad width direction gap lengths from the pad width.

A bonding method according to the present invention is for a bonding apparatus including:
a bonding apparatus providing step of providing a bonding apparatus comprising:
a bonding head movable in an X direction and a Y direction with an X-Y table;
a bonding arm for moving a bonding tool in an approaching and retreating direction with respect to a pad of a semiconductor chip, the bonding arm being attached to the bonding head and having the bonding tool attached to a tip thereof;
a camera for capturing an image of the pad and a bonded ball bonded to the pad, the camera being attached to the bonding head with an optical axis of the camera being offset by a predetermined distance in the X direction and the Y direction with respect to the center line of the bonding tool in bonding operation; and
a control unit for controlling the position of the central axis of the bonding tool in the X direction and the Y direction based on an offset amount of the bonding head and the image of the pad captured with the camera,
an outline obtaining step of obtaining each of the sides of the pad in a quadrilateral shape and an outline of the bonded ball by processing the image captured with the camera;
a gap length obtaining step of obtaining the each gap length between each of the sides of the pad and each portion of the outline of the bonded ball closest to the corresponding sides of the pad; and
an offset correcting step of correcting the offset amount based on each gap length obtained in the gap length obtaining step.

It is also preferable in the bonding method according to the present invention that
in the outline obtaining step, each of the sides of at least one pad and an outline of a bonded ball bonded to the at least one pad are obtained,
in the gap length obtaining step,
each distance in the Y direction between each of the sides extending in the X direction of the at least one pad and each portion of the outline of the bonded ball closest to the corresponding sides extending in the X direction is obtained serving as each Y direction gap length, and
each distance in the X direction between each of the sides extending in the Y direction of the at least one pad and each portion of the outline of the bonded ball closest to the corresponding sides extending in the Y direction is obtained serving as each X direction gap length, and
in the offset correcting step,
each X direction gap length and each Y direction gap length are respectively compared with tolerable ranges previously set to determine whether or not each X direction gap length and each Y direction gap length fall within the tolerable ranges,
when at least one of the each X direction gap length is outside the tolerable range, the offset amount in the X direction is changed according to the difference between each X direction gap length and the median value of the tolerable range, and
when at least one of each Y direction gap length is outside the tolerable range, the offset amount in the Y direction is changed according to the difference between each Y direction gap length and the median value of the tolerable range.

It is also preferable in the bonding method according to the present invention that
in the outline obtaining step, each of the sides of a plurality of pads in a quadrilateral shape and an outline of a bonded ball bonded to each of the pads are obtained, the plurality of pads having an identical designed gap length, and in the offset correcting step, the offset amount in the X direction is changed according to the difference between an average value of each X direction gap length and the median value of the tolerable range, and the offset amount in the Y direction is changed according to the difference between an average value of each Y direction gap lengths and the median value of the tolerable range.

Alternatively, it is also preferable that in the gap length obtaining step, each X direction gap length is obtained based on the distance in the X direction between each of the sides of the plurality of pads in a quadrilateral shape included in a first group and having an identical designed gap length in the X direction, and each portion of the outline of each bonded ball bonded to each of the pads closest to the corresponding sides extending in the Y direction, and each Y direction gap length is obtained based on the distance in the Y direction between each of the sides of the plurality of pads in a quadrilateral shape included in a second group and having an identical designed gap length in the Y direction, and each portion of the outline of each bonded ball bonded to each of the pads closest to the corresponding sides extending in the X direction.

The present invention effectively improves the bonding accuracy of bonding apparatuses by effectively correcting the offset amount even when carrying out bonding for fine-pitch semiconductor chips. Further, the present invention effectively improves the stability of bonding quality by confirming the size of a pressure-bonded ball during bonding.

BRIEF DESCRIPTION OF THE SEVERAL VIEWS OF THE DRAWINGS

Exemplary embodiments of the present invention will be described in detail based on the following figures, wherein.

DETAILED DESCRIPTION OF THE INVENTION

Figure 1:
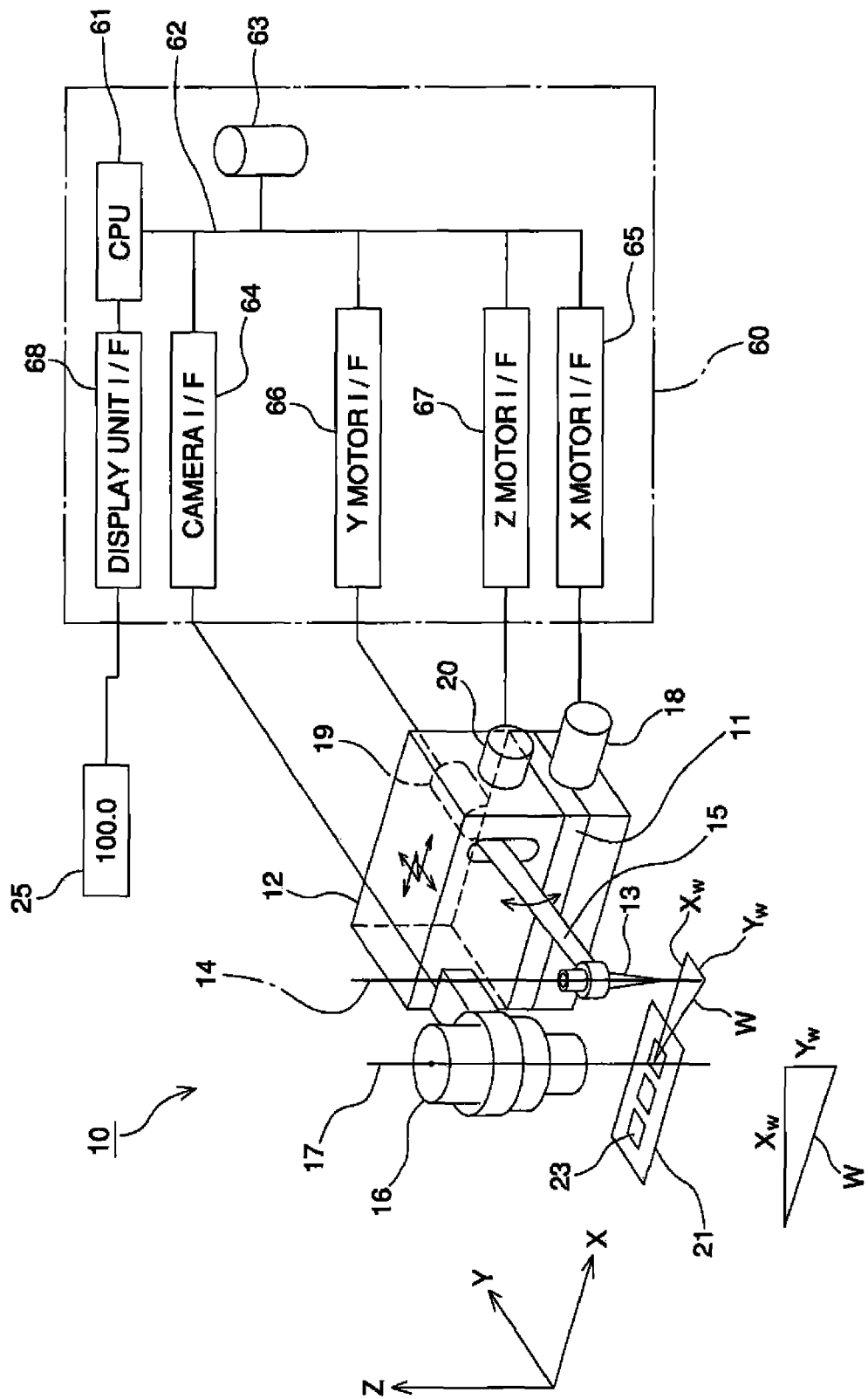
FIG. 1 is an illustrative diagram illustrating a structure of a wire-bonding apparatus according to an exemplary embodiment of the present invention.

Exemplary embodiments according to the present invention will be described below with reference to the accompanying drawings. Referring to FIG. 1, a wire-bonding apparatus 10 of the exemplary embodiments carries out bonding to fine-pitch semiconductor chips, and it is provided with an X-Y table 11 that is movable in the X direction and the Y direction with an X motor 18 and a Y motor 19, a bonding head 12 that is movable in the X direction and the Y direction with the X-Y table 11, a bonding arm 15 to which a capillary 13 as a bonding tool is attached to its tip, a Z motor 20 attached to the bonding head 12 to cause the bonding arm 15 to rotate around the Z axis, and a camera 16 attached to the bonding head 12. In FIG. 1, the X direction represents the direction of feeding a lead frame 21, the Y direction represents the direction along the surface of the lead frame 21 and perpendicular to the X direction, and the Z direction represents the up-down direction vertical to the surface of the lead frame 21.

The capillary 13 attached to the tip of the bonding arm 15 is in a conical shape whose tip is tapered, and has a hole through its center in which a wire is inserted. The tip of the capillary 13 is moved with the Z motor 20 and the bonding arm 15 in an approaching and retreating direction with respect to the lead frame 21 or a semiconductor chip 23 that is attached to the lead frame 21. The capillary central axis 14 is provided such that the tip of the capillary is brought into contact with a surface of the semiconductor chip 23 or the lead frame 21 in the vertical direction.

The camera 16 is provided with an optical system including a lens among others and an imaging area such as a CCD that converts an image formed with the optical system into electrical signals, and the camera optical axis 17 is a central axis of the optical system and a line that passes through the center of the imaging area as well as the central position of the acquired image. The camera optical axis 17 is provided so as to be vertical to the surface of the semiconductor chip 23 or the lead frame 21 whose image is to be picked up.

The capillary central axis 14 and the camera optical axis 17 are both provided to be vertical to the surface of the semiconductor chip 23 or the lead frame 21, and therefore the capillary central axis 14 and the camera optical axis 17 are substantially parallel with each other. Further, as shown in FIG. 1, the camera optical axis 17 is positioned away from the capillary central axis 14 by an X direction offset amount Xw (or merely "offset Xw") and a Y direction offset amount Yw (or merely "offset Yw"). The capillary 13 is attached to the bonding head 12 with the bonding arm, and the camera 16 is fixed to the bonding head 12. Accordingly, the capillary central axis 14 and the camera optical axis 17 always move at the same time in the X direction and the Y direction an offset amount W (or merely "offset W") including the X direction offset Xw and the Y direction offset Yw therebetween.

The X motor 18 and the Y motor 19 that drive the X-Y table 11 of the wire-bonding apparatus 10, the Z motor 20 that drives the bonding arm 15, and the camera 16 are connected to a control unit 60, and configured to be driven by an instruction from the control unit 60. The control unit 60 is provided with a CPU 61 that carries out processing and computation of signals, and a memory 63 that stores data for control bonding, and the control unit 60 is further provided with a camera interface 64, an X motor interface 65, a Y motor interface 66, and a Z motor interface 67. These interfaces convert the instruction from the CPU 61 respectively into control signals for the camera 16, the X motor 18, the Y motor 19, the Z motor 20 and output the signals. Each of the interfaces 64, 65, 66, and 67, the memory 63, and the CPU 61 are connected via a data bus 62, enabling reception and transmission of the signals between each other. The control unit 60 constitutes a single computer. The wire-bonding apparatus 10 is configured to process the image acquired from the camera 16, calculates the diameter of the pressure-bonded ball formed on a semiconductor chip, and displays the diameter of the pressure-bonded ball in a display unit 25 via a display unit interface 68.

Figure 2:
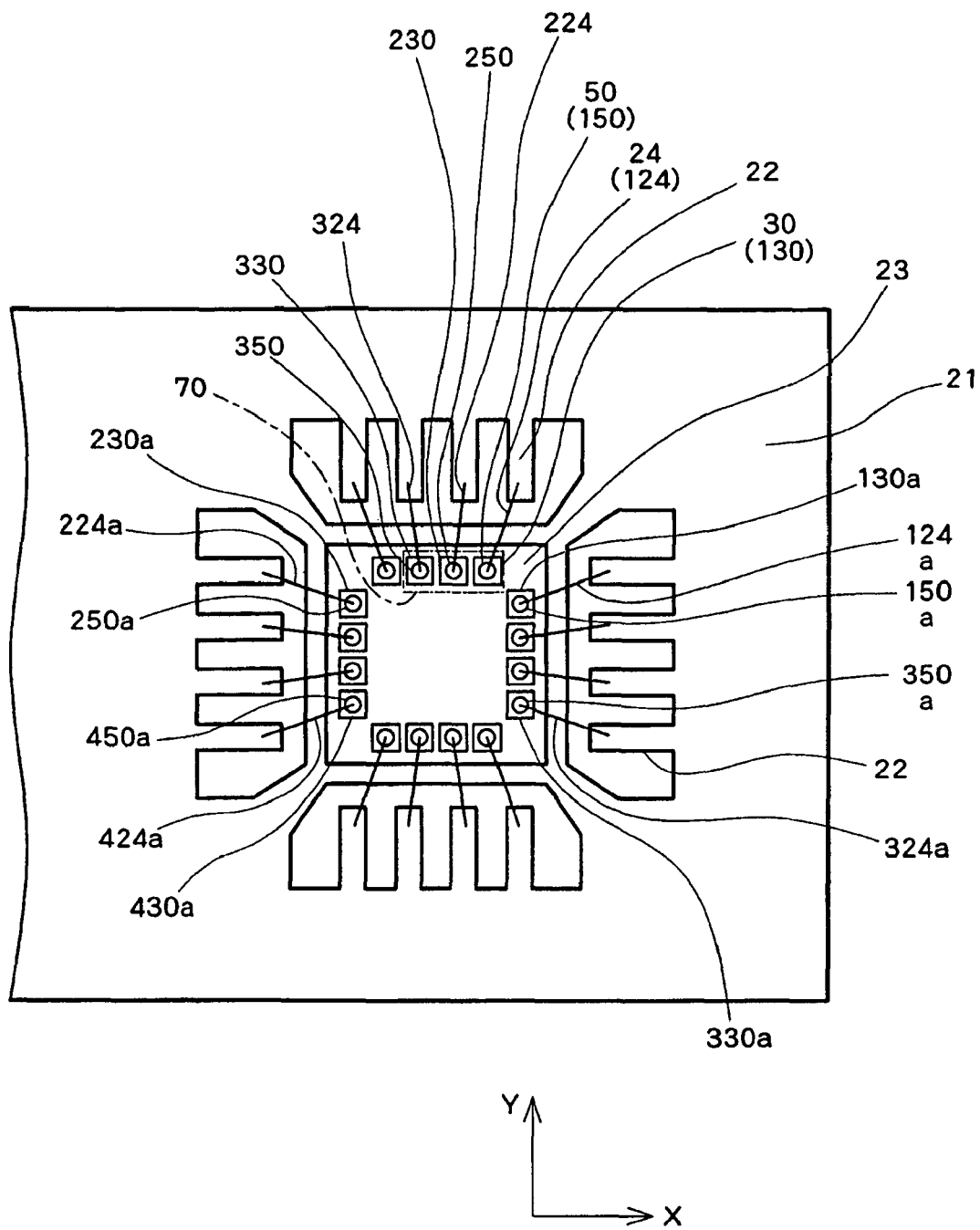
FIG. 2 is a plan view illustrating a semiconductor device bonded with the wire-bonding apparatus according to an exemplary embodiment of the present invention.

Referring to FIG. 2, when pads 30, 130, 130a, 230, 230a, 330, 330a, and 430a on a fine-pitch semiconductor chip 23 are respectively connected with leads 22 of the lead frame 21 with wires 24, 124, 124a, 224, 224a, 324, 324a, and 424a by the wire bonding apparatus 10 as structured above, the wires 24, 124, 124a, 224, 224a, 324, 324a, 424a are disposed substantially radially toward the respective leads 22 from the center of the semiconductor chip 23. Further, pressure-bonded balls 50, 150, 150a, 250, 250a, 350, 350a, and 450a are formed respectively on the upper surfaces of the pads 30, 130, 130a, 230, 230a, 330, 330a, and 430a. The output power of the ultrasonic vibration for bonding an initial ball to a pad can be not large when bonding is made to a fine-pitch semiconductor chip; accordingly, the pressure-bonded balls 50, 150, 150a, 250, 250a, 350, 350a, and 450a respectively formed on the pads 30, 130, 130a, 230, 230a, 330, 330a, and 430a are insusceptible to the direction of vibration of ultrasonic power, and each pressure-bonded ball rarely takes an oval shape and is formed substantially in a true circle.

Figure 3:
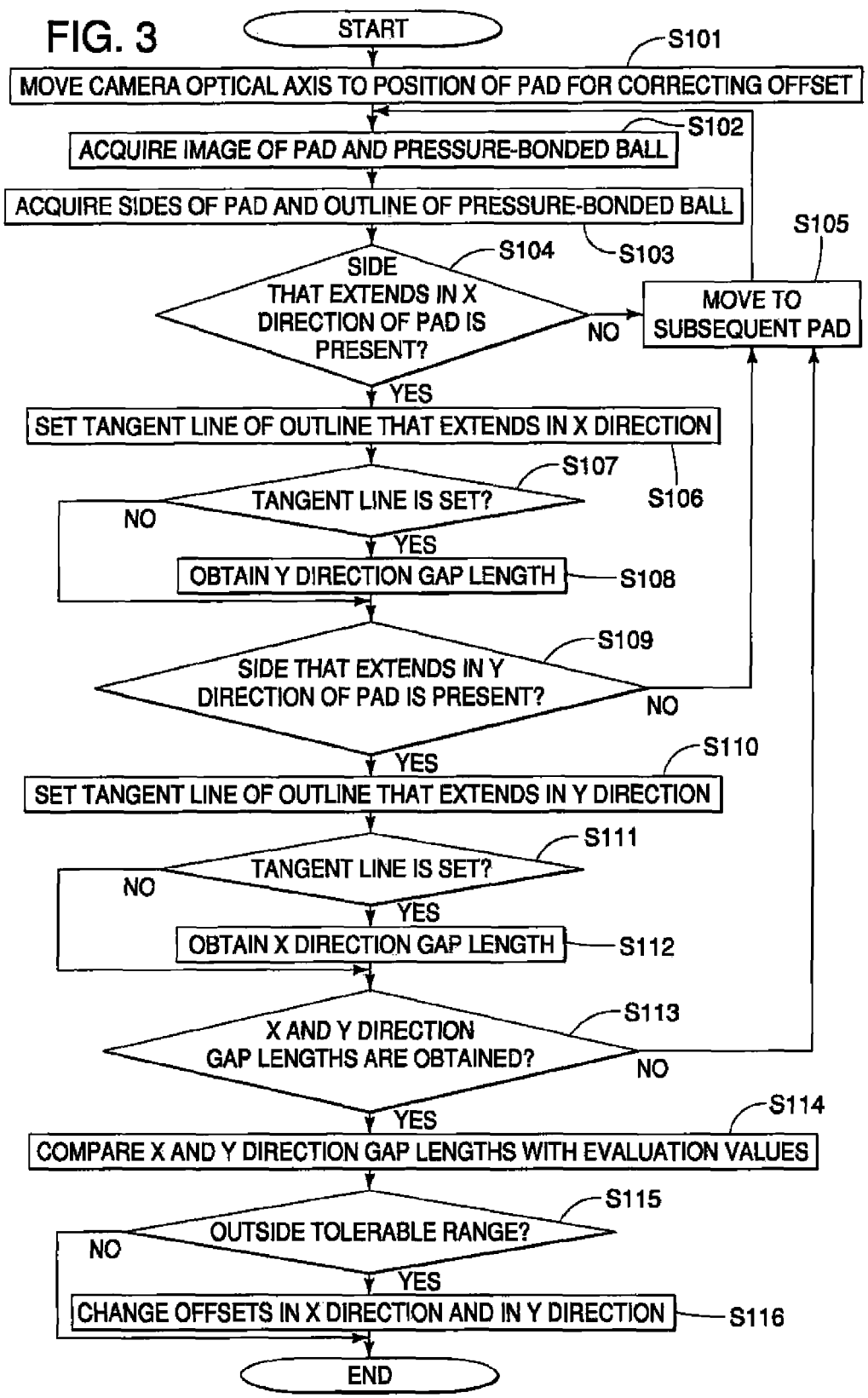
FIG. 3 is a flowchart illustrating an operation of the wire-bonding apparatus according to an exemplary embodiment of the present invention.

A method of correcting the offset W of the semiconductor chip 23 that has been bonded as shown in FIG. 2 will be described with reference to FIG. 3 to FIG. 6. FIG. 3 is a flowchart illustrating the steps of a correction of the offset W.

In Step S101 in FIG. 3, the CPU 61 of the control unit 60 shown in FIG. 1 outputs an instruction for moving the camera optical axis 17 shown in FIG. 1 to a position of the pad 30 for correcting the offset W shown in FIG. 2. As shown in FIG. 2, the pad 30 for correcting the offset W is substantially in a square shape with its four sides each extending along the X direction and the Y direction. In other words the pad 30 is in a quadrilateral shape. Further, the instruction from the CPU is converted into control signals for the X motor 18 and the Y motor 19 respectively with the X motor interface 65 and the Y motor interface 66 shown in FIG. 1, to move the bonding head 12 in the X direction and the Y direction. With this operation, the camera optical axis 17 is moved to the position of the pad 30. The position to which the camera optical axis 17 is moved is not particularly limited as long as the pad 30 and the pressure-bonded ball 50 bonded on the pad 30 are included in the field of view of the camera 16.

In Step S102 in FIG. 3, upon completion of the movement of the camera 16, the CPU 61 of the control unit 60 outputs an instruction for acquiring the image of the pad 30 and the pressure-bonded ball 50 that are within the field of view of the camera 16. This instruction is converted, with the camera interface 64 shown in FIG. 1, into a control signal for acquiring the image in the field of view of the camera 16 as electrical signals, and the image is acquired from the camera 16 and stored in the memory 63.

Figure 4:
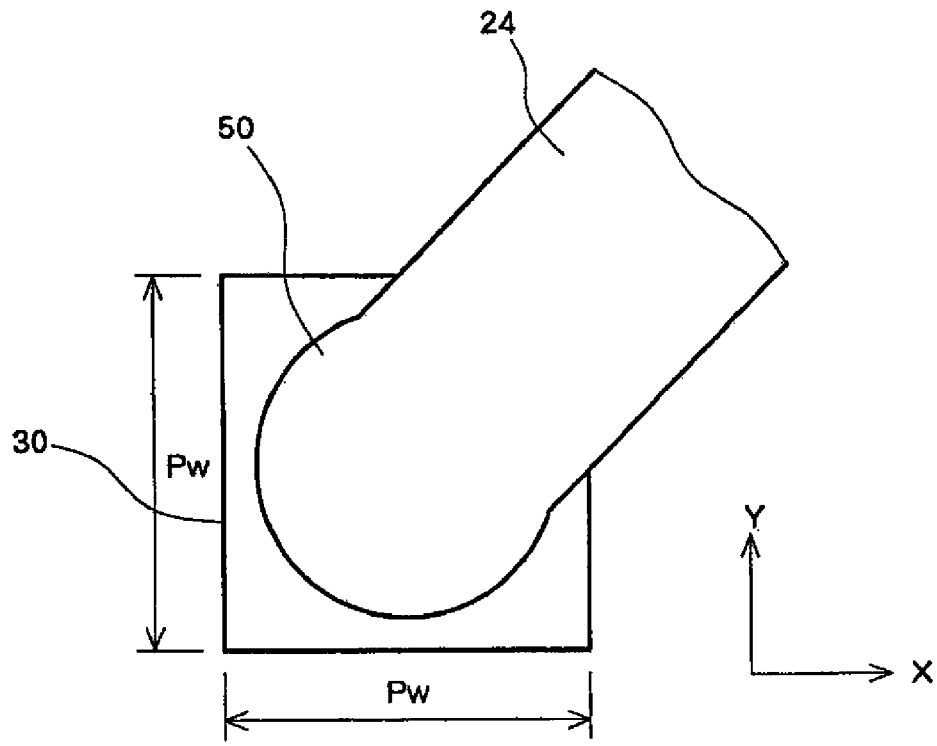
FIG. 4 is an illustrative diagram illustrating an image acquired with a camera of the wire-bonding apparatus according to an exemplary embodiment of the present invention.

The acquired image shown in FIG. 4 includes the pad 30, the pressure-bonded ball 50 pressure-bonded to the pad 30, and the wire 24 that extends in an oblique direction from the pressure-bonded ball 50. The pad 30 is small since it is disposed at a fine-pitch, and the diameter of the pressure-bonded ball 50 is also small so as to be within the small pad 30. Therefore, the diameter of the pressure-bonded ball 50 is only slightly larger than that of the wire 24, and the upper right portion of the pad 30 in the acquired image is mostly hidden under the wire 24 as shown in FIG. 4.

In Step S103 in FIG. 3, the CPU 61 of the control unit 60 shown in FIG. 1 outputs an instruction for processing the image stored in the memory 63 and obtaining the sides of the pad 30 and the outline of the pressure-bonded ball 50. The CPU 61 reads out the image data stored in the memory 63, recognizes and obtains the sides of the pad 30 as lines from the two-dimensional image, and obtains the outline of the pressure-bonded ball 50 as a curving line by, for example, a digitizing process.

Figure 5:
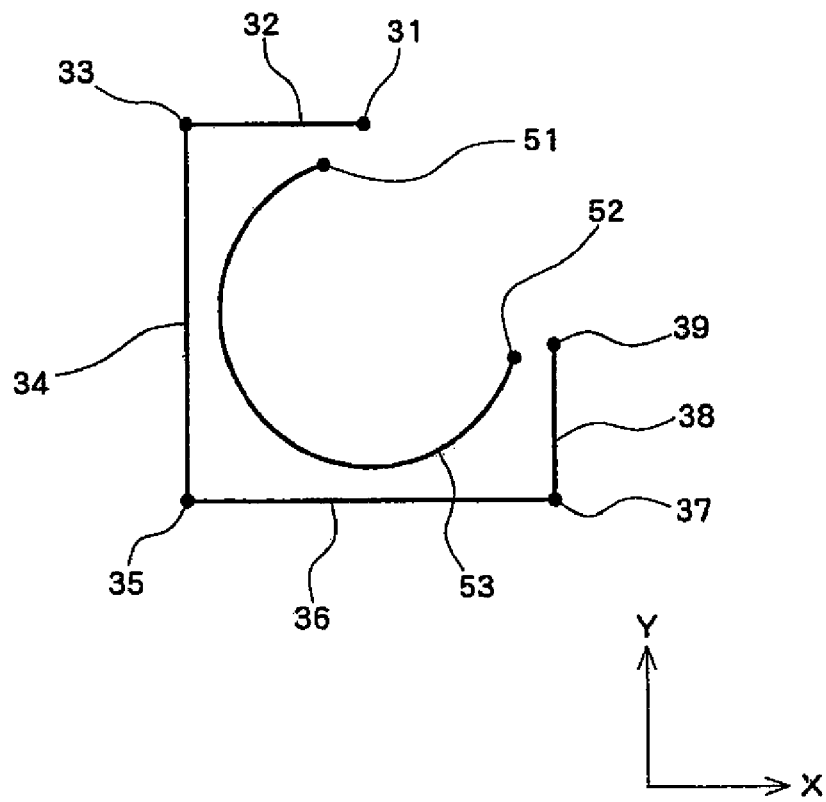
FIG. 5 is an illustrative diagram illustrating line segments of the sides of a pad and the curving line of an outline of a pressure-bonded ball obtained by processing the image shown in FIG. 4.

As shown in FIG. 5, upon processing of the image, the four sides that define the pad 30 are obtained as four line segments including the line segment 32 between the point 31 and the point 33, the line segment 34 between the point 33 and the point 35, the line segment 36 between the point 35 and the point 37, and the line segment 38 between the point 37 and the point 39. The portion between the point 31 and the point 39 is hidden under the wire 24 that extends from the pressure-bonded ball 50, and its height is different from that of the surface of the pad 30. In the image focused on the surface of the pad 30, the contrast in the portion relating to the wire 24 is low due to a focus error, and the outline cannot be obtained. Accordingly, it is not possible to recognize the outer line of the side even by, for example, the digitizing process and the line segment for this portion is not obtained.

For the outline of the pressure-bonded ball 50, it is possible to obtain the outline by, for example, digitizing the high-contrast portion in the image focused on the surface of the pad 30. However, as the height at the portion for the wire 24 that extends from the pressure-bonded ball 50 is different from that of the surface of the pad 30, the contrast in the portion relating to the wire 24 is low due to a focus error in the image focused on the surface of the pad 30, and the outline cannot be obtained. Accordingly, the outline of the pressure-bonded ball 50 is obtained as a curving line 53 between the point 51 and the point 52 excluding the rising portion to the wire as shown in FIG. 5.

In Step S104 in FIG. 3, the CPU 61 of the control unit 60 shown in FIG. 1 determines whether or not the line segment representing the side that extends in the X direction is recognized in the obtained line segments 32, 34, 36, and 38 respectively representing the sides of the pad 30. If the line segment representing the side that extends in the X direction is not recognized in the obtained line segments, then the CPU 61 determines that it is not possible to correct the X direction offset Xw using the obtained line segments, moves the camera optical axis 17 to a subsequent pad in Step S105 in FIG. 3, and carries out Steps S102 to S104 shown in FIG. 3 until the line segment representing the side of the pad 30 that extends in the X direction is obtained. In this exemplary embodiment, the line segments 32 and 36 are the line segments representing the sides that extend in the X direction, and the CPU 61 of the control unit 60 recognizes that two line segments representing the sides that extend in the X direction have been obtained.

Figure 6:
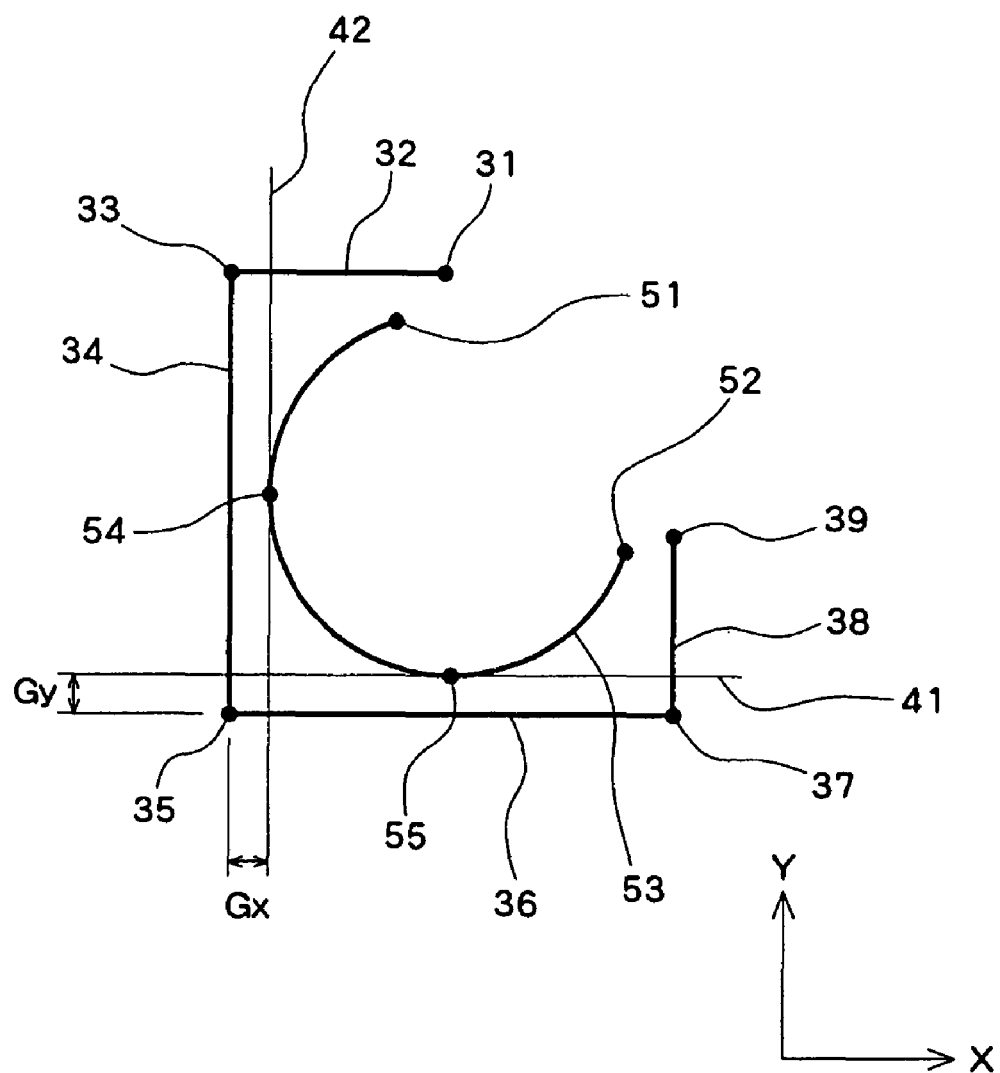
FIG. 6 is an illustrative diagram illustrating gap lengths between the line segments of the sides of the pad and the curving line of the outline of the pressure-bonded ball shown in FIG. 5.

Next, in Step S106 in FIG. 3, when it is recognized that the line segments 32 and 36 are the line segments representing the sides that extend in the X direction, the CPU 61 of the control unit 60 shown in FIG. 1 sets a tangent line 41 that extends in the X direction and is brought into contact with the curving line 53 representing the outline of the pressure-bonded ball 50 as shown in FIG. 6. The setting of the tangent line can be carried out by image processing of moving the line segment that extends in the X direction along the Y direction, and obtaining the line segment that passes through the point 55 where the number of intersection points between the line segment and the curving line 53 is reduced from two to one as the tangent line 41. Alternatively, it is possible to obtain the tangent line 41 by setting an approximate circular arc that represents the curving line assuming that the curving line 53 is a circular arc representing the outline of the pressure-bonded ball 50, and obtaining the line that passes the point 55 that is brought into contact with the approximate circular arc by calculation. Since the shape of the pressure-bonded balls formed on pads of a fine-pitch semiconductor chip is substantially in a true circle as in this exemplary embodiment, it is possible to approximate the outline fairly accurately by approximating the outline to a circular arc.

When the tangent line 41 is set in Step S107 in FIG. 3 in the next Step S108, the distance between the tangent line 41 and the line segment 36 is obtained as a Y direction gap length Gy between the outline of the pressure-bonded ball 50 and the side of the pad 30 and stored in the memory 63. As shown in FIG. 6, since the curving line 53 representing the outline of the pressure-bonded ball 50 extends only to the point 51 and the tangent line of the outline that extends in the X direction cannot be set on the side of the line segment 32, it is not possible to set the tangent line 41 on the side of the line segment 32. Thus, the single Y direction gap length Gy can be obtained from the image of the single pad 30.

Then, for example, when the curving line 53 representing the outline of the pressure-bonded ball 50 cannot be sufficiently obtained and it is not possible to set the tangent line 41 on either side of the line segments 32 and 36 representing the sides of the pad 30 in Step S107 in FIG. 3, then the CPU 61 of the control unit 60 carries out Step S109 in FIG. 3 without obtaining the Y direction gap length Gy.

In Step S109 in FIG. 3, the CPU 61 of the control unit 60 shown in FIG. 1 determines whether or not the line segment representing the side that extends in the Y direction is recognized in the obtained line segments 32, 34, 36, and 38 respectively representing the sides of the pad 30. If the line segment representing the side that extends in the Y direction is not recognized in the obtained line segments, the CPU 61 determines that it is not possible to correct the Y direction offset Yw using the obtained line segments, moves the camera optical axis 17 to the subsequent pad in Step S105 in FIG. 3, and carries out Steps S102 to S109 shown in FIG. 3 until the line segment representing the side of the pad 30 that extends in the Y direction is obtained. In this exemplary embodiment, the line segments 34 and 38 are the line segments representing the sides that extend in the Y direction, and the CPU 61 of the control unit 60 recognizes that two line segments representing the sides that extend in the Y direction have been obtained.

Then, in Steps S110, S111, and S112 of FIG. 3, the tangent line 42 of the curving line 53 that extends in the Y direction is set in the same manner as described previously, and the distance between the tangent line 42 and the line segment 34 is obtained as an X direction gap length Gx between the outline of the pressure-bonded ball 50 and the side of the pad 30 and stored in the memory 63.

Next in Step S113 in FIG. 3, when one of the X direction gap length Gx and the Y direction gap length Gy is obtained, then the CPU 61 of the control unit 60 shown in FIG. 1 moves the camera optical axis 17 to the subsequent pad in Step S105 in FIG. 3, and repeats the operation from Step S102 to Step S112 until both of the X direction gap length Gx and the Y direction gap length Gy are obtained. As shown in FIG. 6, when both of the X direction gap length Gx and the Y direction gap length Gy are obtained respectively between the two line segments 34 and 36 representing two adjacent sides of the same pad 30 and the curving line 53 representing the outline of the pressure-bonded ball, the CPU 61 of the control unit 60 moves to Step S114 in FIG. 3 without repeating the operation from Step S102 to Step S112.

In Step S114 in FIG. 3, when both of the X direction gap length Gx and the Y direction gap length Gy are obtained, the CPU 61 of the control unit 60 shown in FIG. 1 compares the X direction gap length Gx and the Y direction gap length Gy stored in the memory 63 with the tolerable ranges of the respective gap lengths stored in the memory 63. Then, in Step S115 in FIG. 3, when one of the X direction gap length Gx and the Y direction gap length Gy falls outside its tolerable range, the offset W is corrected by changing corresponding one of the X direction offset Xw and the Y direction offset Yw in Step S116 in FIG. 3. Here, it is possible to set an upper limit of the tolerable range to be a value obtained by adding the resolution length of the camera 16 to the corresponding designed gap length and a lower limit of the tolerable range to be a value obtained by subtracting the resolution length of the camera 16 from the corresponding designed gap length. Alternatively, the upper limit can be a value obtained by adding the error tolerable in the bonding to the corresponding designed gap length, and the lower limit can be a value obtained by subtracting the error tolerable in the bonding from the designed gap length. In this case, a median value of the tolerable range corresponds to the designed gap length. The tolerable range can be constant, or can change depending on the semiconductor chip 23. The X direction offset Xw and the Y direction offset Yw are changed respectively by the difference between the X direction gap length Gx and the median value of the tolerable range and by the difference between the Y direction gap length Gy and the median value of the tolerable range. Alternatively, the correction of the offset W can be carried out by changing the X direction offset Xw by the amount obtained by multiplying the difference between the X direction gap length Gx and the median value of the tolerable range by a predetermined coefficient smaller than 1, and changing the Y direction offset Yw by the amount obtained by multiplying the difference between the Y direction gap length Gy and the median value of the tolerable range by the predetermined coefficient smaller than 1. In this case, the correction of the offset W can be carried out by, for example, setting the predetermined coefficient to be ½, and changing the offsets Xw and Yw several times so that the both become gradually closer to the median values of the tolerable ranges, respectively.

According to this exemplary embodiment described above, the offset W can be corrected based only on the gap lengths in the corresponding directions between the respective sides of the pad 30 and the outline of the pressure-bonded ball 50 without obtaining the central position of the pressure-bonded ball 50. Therefore, it is advantageously possible to effectively correct an offset amount and to improve the bonding accuracy even when bonding to fine-pitch semiconductor devices in which the diameter of the pressure-bonded ball 50 is as large as that of the wire 24.

Next, calculation and display of the diameter of the pressure-bonded ball 50 in the wire-bonding apparatus 10 of this exemplary embodiment will be described. The steps from the acquisition of the image to the acquisition of the X direction gap length Gx and the Y direction gap length Gy are carried out in the same manner as in the case of correcting the offset W as previously described. Referring to FIG. 4, the pad 30 is in a square shape having a pad width Pw both in the X direction and the Y direction, and the pad width Pw is stored in the memory 63 of the control unit 60. The CPU 61 of the control unit 60 reads out the pad width Pw from the memory 63, and calculates the diameter of the pressure-bonded ball 50 by subtracting, from Pw, a value twice as large as the X direction gap length Gx, a value twice as large as the Y direction gap length Gy, or a value twice as large as an average value of the X direction gap length Gx and the Y direction gap length Gy.

Upon completion of the calculation of the diameter of the pressure-bonded ball 50, the CPU 61 of the control unit 60 outputs the diameter of the pressure-bonded ball 50 to the display unit interface 68 shown in FIG. 1, drives the display unit 25 based on the output from the display unit interface 68, and displays the diameter of the pressure-bonded ball 50 in the display unit 25. If the calculated diameter of the pressure-bonded ball 50 differs from the designed value to a large extent, it is possible to alert an operator by, for example, presenting a red display in the display unit 25.

As described above, in this exemplary embodiment, it is possible to calculate the diameter of the pressure-bonded ball based only on the width of the pad 30, the outline of the pressure-bonded ball 50, and the gap lengths in the corresponding directions between the respective sides of the pad 30 and the outline of the pressure-bonded ball 50. Accordingly, it is advantageously possible to effectively calculate the diameter of the pressure-bonded ball 50 even when bonding is performed to fine-pitch semiconductor devices. In addition, since the diameter of the pressure-bonded ball 50 can be confirmed during bonding by the wire-bonding apparatus 10 of this exemplary embodiment, it is advantageously possible to improve the stability of the bonding quality.

Another exemplary embodiment according to the present invention will be described below with reference to FIG. 7 and FIG. 8. Like components previously described referring to FIG. 1 through FIG. 6 are denoted by the same numerals in the present exemplary embodiment and will not be explained.

Figure 7:
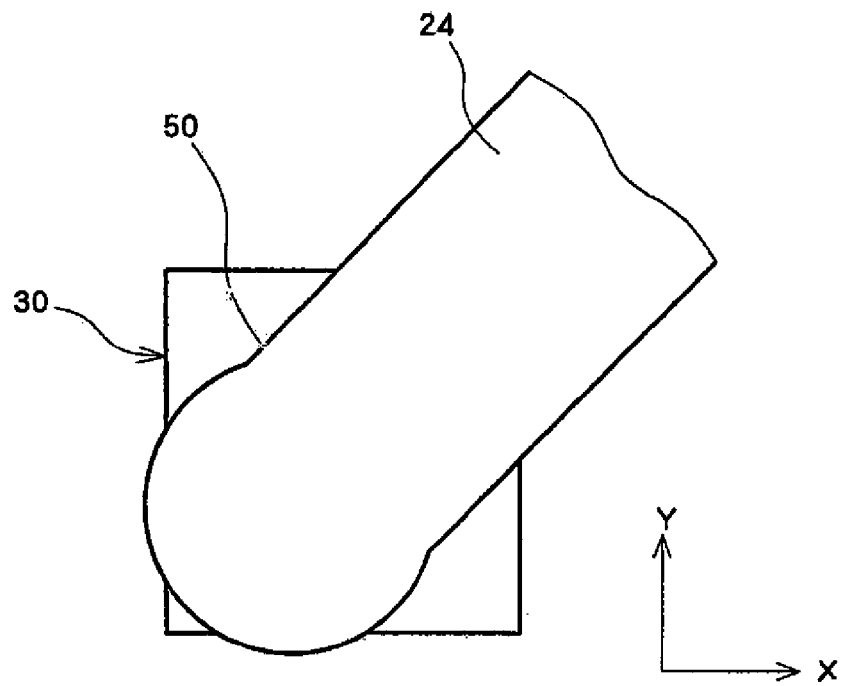
FIG. 7 is an illustrative diagram illustrating an image acquired with the camera of the wire-bonding apparatus according to an exemplary embodiment of the present invention.
Figure 8:
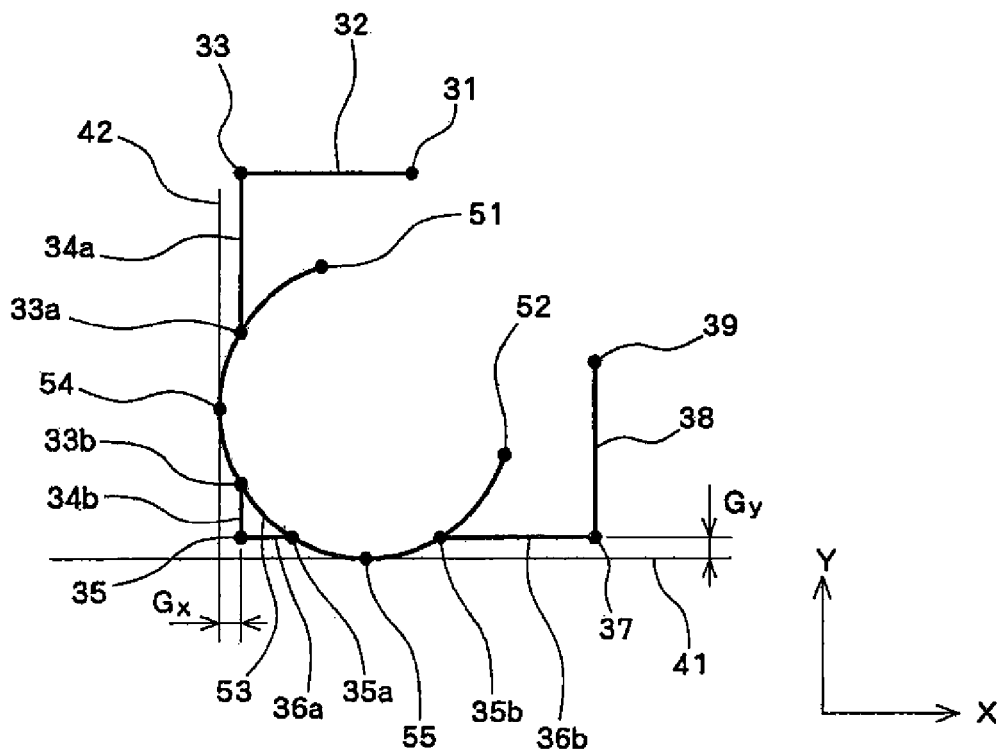
FIG. 8 is an illustrative diagram illustrating gap lengths between line segments of the sides of a pad and the curving line of an outline of a pressure-bonded ball obtained by processing the image shown in FIG. 7.

FIG. 7 shows an image acquired with the camera 16, illustrating a state in which the pressure-bonded ball 50 is bonded to protrude from the pad 30. As shown in FIG. 8, when it is possible to obtained the sides of the pad 30 respectively as the line segments 32, 34a, 34b, 36a, 36b, and 38 and the curving line 53 representing the outline of the pressure-bonded ball 50 from the image illustrating the state in which the pressure-bonded ball 50 is bonded to protrude from the sides of the pad 30 in the same manner as in the exemplary embodiment previously described, and when the tangent lines 41 and 42 that are in contact with the curving line 53 are set in the same manner, the distance between the tangent line 41 and the line segment 36a or the line segment 36b can be obtained as the Y direction gap length Gy, and the distance between the tangent line 42 and the line segment 34a or the line segment 34b can be obtained as the X direction gap length Gx. However, in this case, the X direction gap length Gx and the Y direction gap length Gy are both negative values. It; nonetheless, it is possible to carry out the correction of the offset W based on the X direction gap length Gx and the Y direction gap length Gy in the same manner as the exemplary embodiment previously described.

According to this exemplary embodiment, it is advantageously possible to effectively correct the offset W even when the pressure-bonded ball 50 protrudes from the pad 30, in addition to the same effects as the exemplary embodiment previously described.

Yet another exemplary embodiment according to the present invention will be described below with reference to FIG. 9 through FIG. 13. Like components previously described referring to FIG. 1 through FIG. 6 are denoted by the same numerals in the present exemplary embodiment and will not be explained. The method described according to the exemplary embodiment previously described with reference to FIG. 1 through FIG. 6 includes sequentially processing the image of the pad 30 and the pressure-bonded ball 50 pressure-bonded to the pad 30, obtaining the X direction gap length Gx and the Y direction gap length Gy one by one, and correcting the offset W based on the X direction gap length Gx and the Y direction gap length Gy that have been obtained. However, according to this exemplary embodiment of FIG. 9 through FIG. 13, a plurality of X direction gap lengths Gx and a plurality of Y direction gap lengths Gy are obtained based on the sides of a plurality of pads in the same group, in which X direction widths Px and Y direction widths Py of the pads are the same and the designed gap lengths in the respective directions are the same, as well as on outlines of pressure-bonded balls each bonded to each pad, and the offset W is corrected based on the average values respectively of the X direction gap lengths Gx and the Y direction gap lengths Gy that are obtained and on the median values of the tolerable ranges of the gap lengths.

Figure 9:
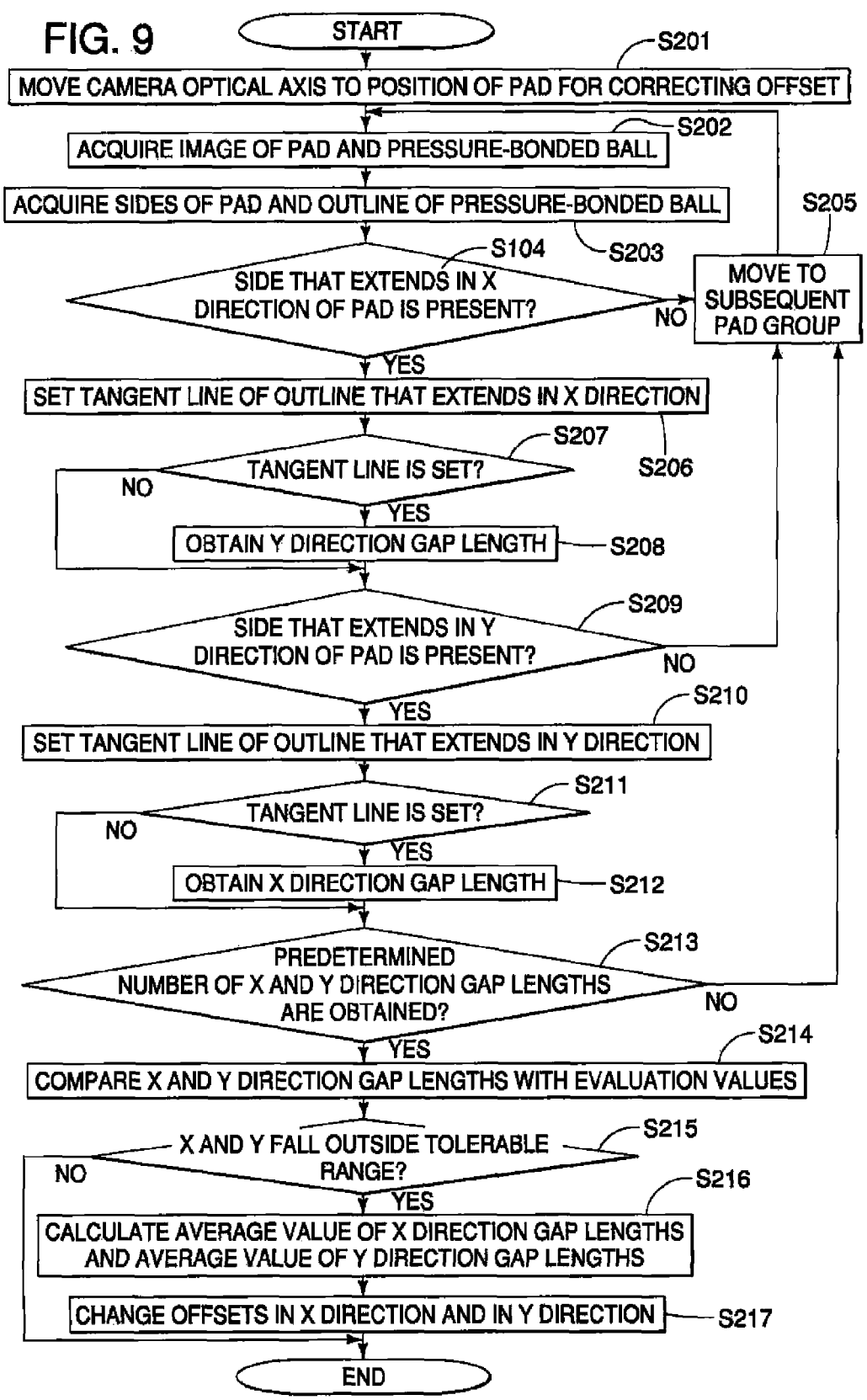
FIG. 9 is a flowchart illustrating an operation of the wire-bonding apparatus according to yet another exemplary embodiment of the present invention.

In Step S201 in FIG. 9, the CPU 61 of the control unit 60 shown in FIG. 1 outputs an instruction for moving the camera optical axis 17 shown in FIG. 1 to a position at which the image of a pad group 70 for correcting the offset W including a plurality of pads of the same size shown in FIG. 2 can be acquired. Referring to FIG. 2, the pad group 70 for correcting the offset W includes three pads 130, 230, and 330. The pads 130, 230, and 330 are substantially in a square shape, and the pad widths Px in the X direction and the pad widths Py in the Y direction of the pads are the same. Each side of the pads 150, 250, and 350 is either in the X direction or in the Y direction. The position to which the camera optical axis 17 is moved is not particularly limited as long as the camera optical axis 17 can be moved to a position at which the field of view of the camera 16 includes the three pads 130, 230, and 330 in the pad group 70 and the pressure-bonded balls 150, 250, and 350 respectively bonded to the pads 130, 230, and 330.

Figure 10:
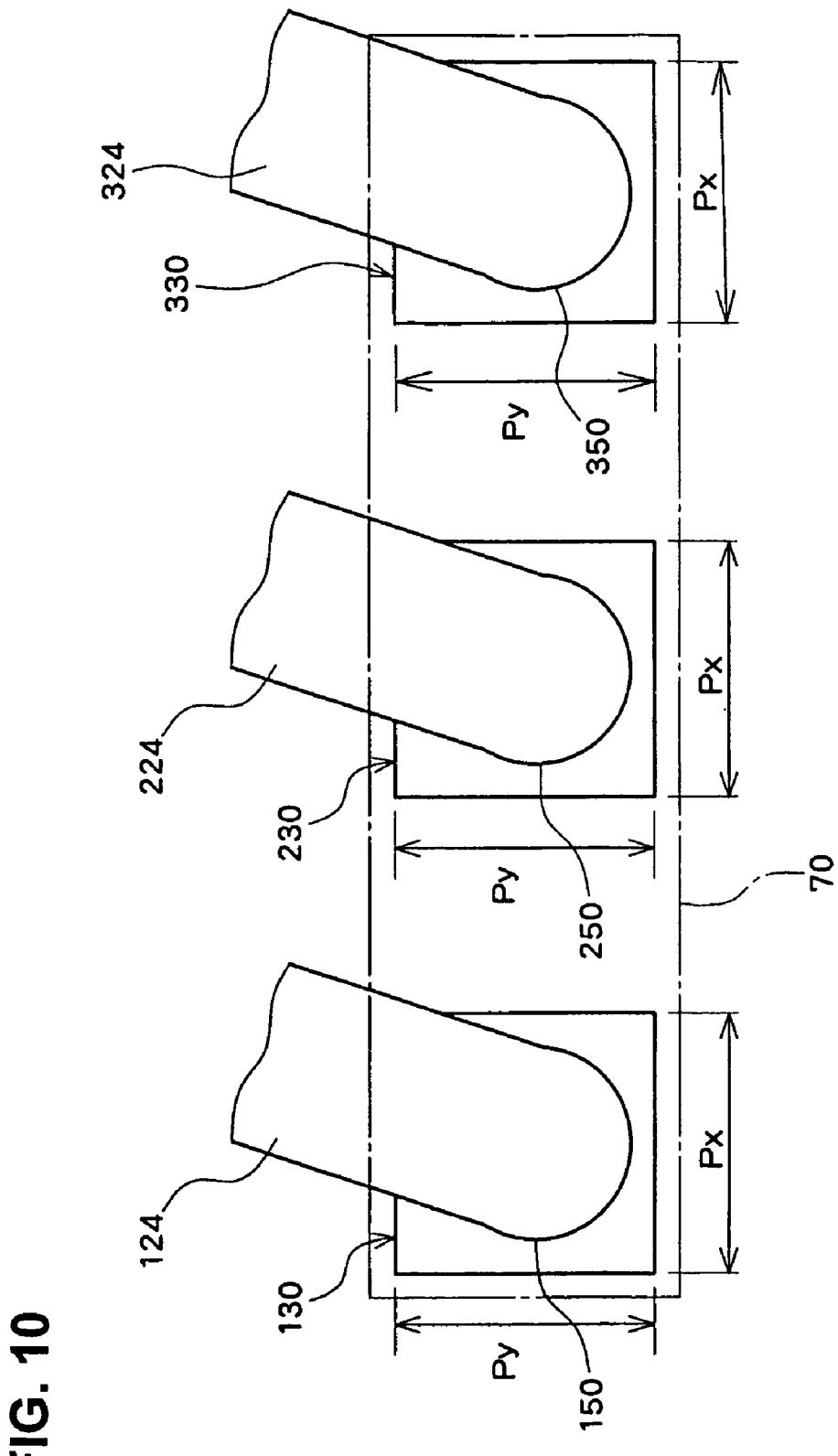
FIG. 10 is an illustrative diagram illustrating an image acquired with the camera of the wire-bonding apparatus according to yet another exemplary embodiment of the present invention.

In Step S202 in FIG. 9, upon completion of the movement of the camera 16, the CPU 61 of the control unit 60 outputs an instruction for acquiring the image of the three pads 130, 230, and 330 in the pad group 70 for correcting the offset W and the pressure-bonded balls 150, 250, and 350 bonded to the respective pads that are included in the field of view of the camera 16, acquires the image from the camera 16 and stores the image in the memory 63 based on this instruction. As shown in FIG. 10, the acquired image includes the three pads 130, 230, and 330 each having the pad width Px in the X direction and the pad width Py in the Y direction, the pressure-bonded balls 150, 250, and 350 that are bonded to the respective pads, and wires 124, 224, and 324 that respectively extend from the pressure-bonded balls 150, 250, and 350.

In Step S203 in FIG. 9, the CPU 61 of the control unit 60 shown in FIG. 1 reads out the image data stored in the memory 63, recognizes and acquires the sides of the pads 130, 230, and 330 as lines from the two-dimensional image and acquires the outlines of the pressure-bonded balls 150, 250, and 350 as curving lines by, for example, a digitizing process, for example.

Figure 11:
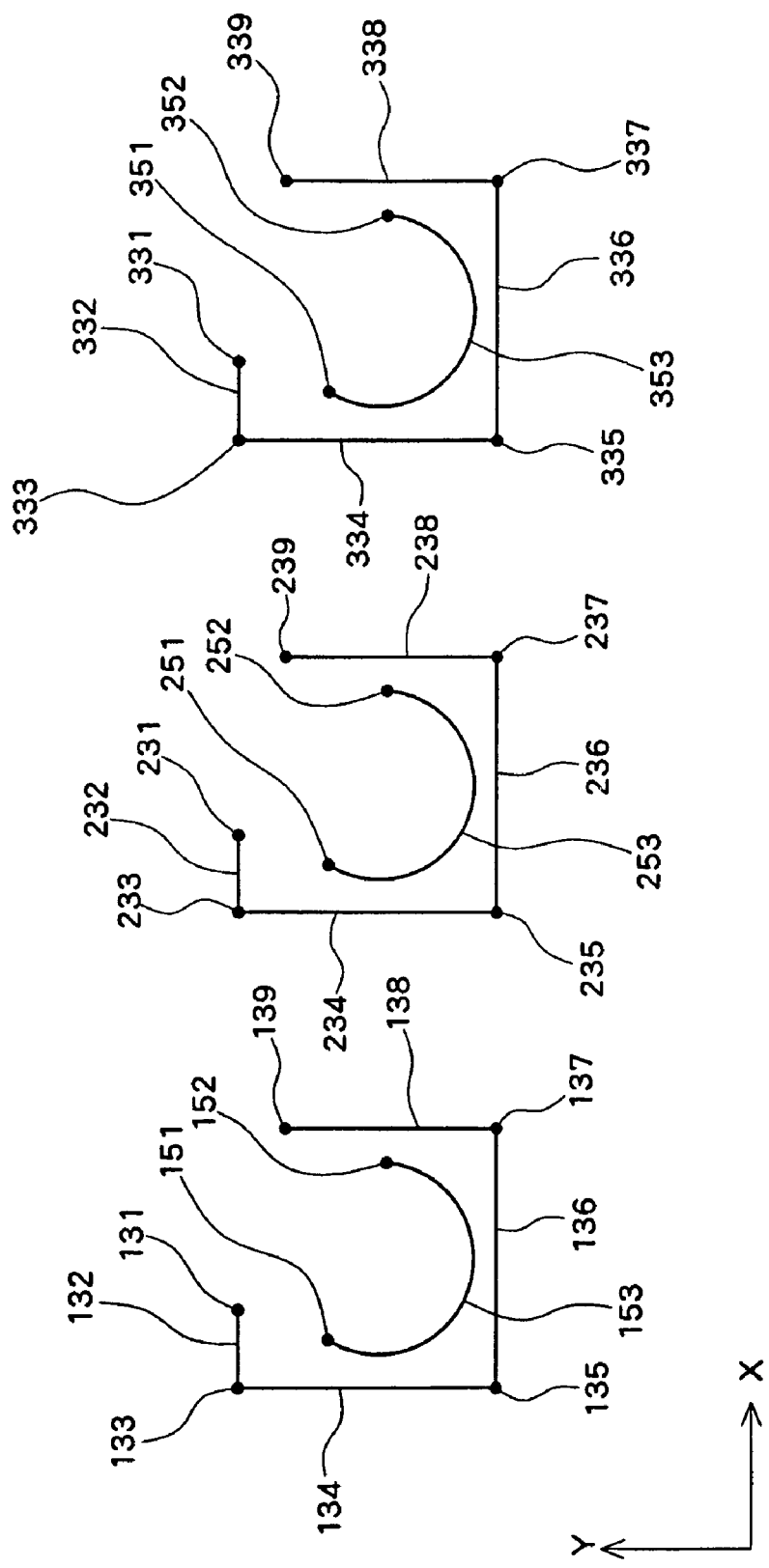
FIG. 11 is an illustrative diagram illustrating line segments of the sides of a pad, the curving line of an outline of a pressure-bonded ball, and the angle between the line segments of the sides of the pad in the X direction and the Y direction acquired by processing the image shown in FIG. 10.

In FIG. 11, similarly to the previously explained exemplary embodiment, the four sides that define the pad 130 are acquired as four line segments including the line segment 132 between the point 131 and the point 133, the line segment 134 between the point 133 and the point 135, the line segment 136 between the point 135 and the point 137, and the line segment 138 between the point 137 and the point 139. Since the portion between the point 131 and the point 139 is hidden under a wire 124, it is not possible to recognize the outer line of the side even by, for example, the digitizing process, and therefore the line segment for this portion is not be obtained. The CPU 61 of the control unit 60 carries out the image processing for the remaining two pads 230 and 330 in the same manner, and obtains four line segments 232, 234, 236, and 238 and four line segments 332, 334, 336, and 338 for the sides of the respective pads. Further, the portion between the point 231 and the point 239 and the portion between the point 331 and the point 339 are hidden under wires 224 and 324, respectively, and therefore line segments for these portions are not be obtained.

As shown in FIG. 11, similarly to the exemplary embodiment previously described, the CPU 61 of the control unit 60 shown in FIG. 1 obtains the outlines of the pressure-bonded balls 150, 250, and 350 as a curving line 153 between the point 151 and the point 152, the curving line 253 between the point 251 and the point 252, and the curving line 353 between the point 351 and the point 352 respectively excluding the rising portions to the wires 124, 224, and 324.

In Step S204 in FIG. 9, the CPU 61 of the control unit 60 shown in FIG. 1 determines whether or not the line segment representing the side that extends in the X direction is recognized in the line segments 132-138, 232-238, and 332-338 that have been obtained. If the line segment representing the side that extends in the X direction is not recognized in the obtained line segments, the CPU 61 determines that it is not possible to correct the X direction offset Xw for this pad group 70, moves the camera optical axis 17 to a subsequent pad group 70 in Step S205 in FIG. 9, and repeats Steps S202 and S203 in FIG. 9 until the line segment representing the side that extends in the X direction is obtained. In this exemplary embodiment, the six line segments 132, 136, 232, 236, 332, and 336 are the line segments representing the sides that extend in the X direction, and the CPU 61 of the control unit 60 recognizes that six line segments representing the sides that extend in the X direction have been obtained.

Figure 12:
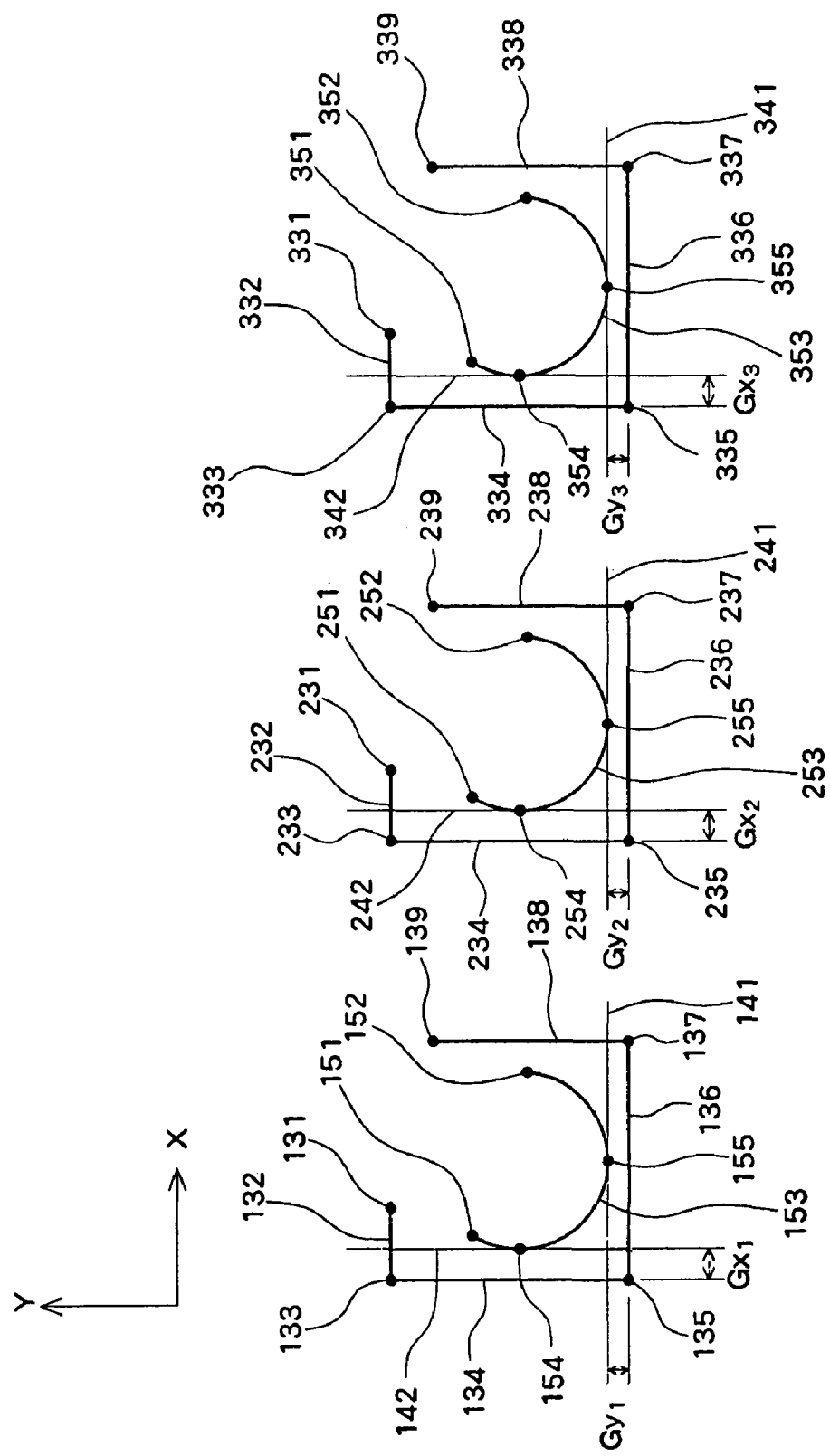
FIG. 12 is an illustrative diagram illustrating gap lengths between the line segments of the sides of the pad and the curving line of the outline of the pressure-bonded ball shown in FIG. 11.

In Step S206 in FIG. 9, when it is recognized that the line segments 132, 136, 232, 236, 332, and 336 are the line segments representing the sides that extend in the X direction, the CPU 61 of the control unit 60 shown in FIG. 1 sets the tangent lines 141, 241, and 341 that extend in the X direction and are respectively brought into contact with the curving lines 153, 253, and 353 representing the outlines of the pressure-bonded balls 150, 250, and 350 at tangent points 155, 255, and 355, as shown in FIG. 12. The setting of the tangent lines can be carried out by the same method as described according to the previous exemplary embodiment.

In Step S207 in FIG. 9, when the tangent lines 141, 241, and 341 are set, in the next Step S208, the distance between the tangent line 141 and the line segment 136 is obtained as a Y direction gap length $Gy_1$ between the outline of the pressure-bonded ball 150 and the side of the pad 130, the distance between the tangent line 241 and the line segment 236 is obtained as a Y direction gap length $Gy_2$ between the outline of the pressure-bonded ball 250 and the side of the pad 230, and the distance between the tangent line 341 and the line segment 336 is obtained as a Y direction gap length $Gy_3$ between the outline of the pressure-bonded ball 350 and the side of the pad 330, and these gap lengths are stored in the memory 63. Similarly to the previously explained exemplary embodiment, it is not possible to set the tangent lines 141, 241, and 341 on the sides of the line segments 132, 232, and 332. Thus, the number of each of the Y direction gap lengths $Gy_1$, $Gy_2$, $Gy_3$ that can be obtained from the corresponding one of the image of the pads 130, 230, and 330 is one.

Further, for example, when the curving line 53 representing the outline of the pressure-bonded ball 50 cannot be sufficiently obtained and it is not possible to set the tangent lines 141, 241, and 341 on any side of the line segments 132, 136, 232, 236, 332, and 336 in Step S207 in FIG. 9, then the CPU 61 of the control unit 60 carries out Step S209 in FIG. 9 without obtaining the Y direction gap length Gy.

Similarly to the acquisition of the Y direction gap lengths $Gy_1$, $Gy_2$, and $Gy_3$, the CPU 61 of the control unit 60 determines in Steps S209 to S212 in FIG. 9 whether or not the line segment representing the side that extends in the Y direction is recognized in the obtained line segments 132-138, 232-238, and 332-338. If the line segment representing the side that extends in the Y direction is not recognized in the obtained line segments, the CPU 61 determines that it is not possible to correct the Y direction offset Yw for this pad group 70, moves the camera optical axis 17 to a subsequent pad group 70 in Step S205 in FIG. 9, and repeats Steps S202 to S209 in FIG. 9 until the line segment representing the side that extends in the Y direction is obtained. In this exemplary embodiment, the six line segments 134, 138, 234, 238, 334, and 338 are the line segments representing the sides that extend in the Y direction, and the CPU 61 of the control unit 60 recognizes that six line segments representing the sides that extend in the Y direction have been obtained. Then, by the same method as described previously, the tangent lines 142, 242, and 342 that extend in the Y direction of the curving lines 153, 253, and 353 and are respectively brought into contact with the curving lines 153, 253, and 353 at tangent points 154, 254, and 354 are set. Further, the distance between the tangent line 142 and the line segment 134 is obtained as an X direction gap length $Gx_1$ between the outline of the pressure-bonded ball 150 and the side of the pad 130, the distance between the tangent line 242 and line segment 234 is obtained as an X direction gap length $Gx_2$ between the outline of the pressure-bonded ball 250 and the side of the pad 230, and the distance between the tangent line 342 and line segment 334 is obtained as an X direction gap length $Gx_3$ between the outline of the pressure-bonded ball 350 and the side of the pad 330, and these gap lengths are stored in the memory 63.

In Step S213 in FIG. 9, when the obtained number of either the X direction gap lengths Gx or the Y direction gap lengths Gy is smaller than the predetermined number that is required for calculating an average value, the CPU 61 of the control unit 60 shown in FIG. 1 moves the capillary central axis 14 to the subsequent pad group 70 in Step S205 in FIG. 9, and repeats the operation from Step S202 to Step S212 until the predetermined numbers of the X direction gap lengths Gx and the Y direction gap lengths Gy are obtained. Since the three X direction gap lengths $Gx_1$, $Gx_2$, and $Gx_3$ and the three Y direction gap lengths $Gy_1$, $Gy_2$, and $Gy_3$ are obtained in this exemplary embodiment, the CPU 61 of the control unit 60 carries out Step S214 in FIG. 9.

Since the designed X direction gap lengths of the respective pads 130, 230, and 330 are the same, all of the X direction gap lengths $Gx_1$, $Gx_2$, and $Gx_3$ should fall within the tolerable range in which the designed value is included if the bonding has been carried out as designed. Further, since the designed Y direction gap lengths of the respective pads 130, 230, and 330 are also the same, all of the Y direction gap lengths $Gy_1$, $Gy_2$, and $Gy_3$ should also fall within the tolerable range in which the designed value is included if the bonding has been carried out as designed. Here, it is possible to set the upper limit of the tolerable range to be a value obtained by adding the resolution length of the camera 16 to the corresponding designed gap length and set the lower limit of the tolerable range to be a value obtained by subtracting the resolution length of the camera 16 from the corresponding designed gap length. Alternatively, the upper limit can be a value obtained by adding the error tolerable in the bonding to the corresponding designed gap length, and the lower limit can be a value obtained by subtracting the error tolerable in the bonding from the designed gap length. In this case, the median value of the tolerable range corresponds to the designed gap length. The tolerable range can be constant, or can change depending on the semiconductor chip 23.

Next, in Step S214 in FIG. 9, the CPU 61 of the control unit 60 shown in FIG. 1 compares the X direction gap lengths $Gx_1$, $Gx_2$, and $Gx_3$ and the Y direction gap lengths $Gy_1$, $Gy_2$, and $Gy_3$ stored in the memory 63 with the tolerable ranges of the respective gap lengths stored in the memory 63. Then, in Step S215 in FIG. 9, when one of the X direction gap lengths $Gx_1$, $Gx_2$, and $Gx_3$ falls outside its tolerable range, an average value Gxa of the X direction gap lengths $Gx_1$, $Gx_2$, and $Gx_3$ is calculated in Step S216 in FIG. 9, and the X direction offset Xw is changed by the difference between the average value Gxa and the median value of the tolerable range of the X direction gap length in Step S217 in FIG. 9. In addition, when one of the Y direction gap lengths $Gy_1$, $Gy_2$, and $Gy_3$ falls outside its tolerable range, an average value Gya of the Y direction gap lengths $Gy_1$, $Gy_2$, and $Gy_3$ is calculated, and the Y direction offset Yw is changed by the difference between the average value Gya and the median value of the tolerable range of the Y direction gap length. The X direction offset Xw and the Y direction offset Yw are changed in this manner, whereby the offset W is corrected. Alternatively, the correction of the offset W can be carried out by changing the X direction offset Xw by an amount obtained by multiplying the difference between the X direction gap length Gx and the median value of the tolerable range by the predetermined coefficient smaller than 1, and changing the Y direction offset Yw by an amount obtained by multiplying the difference between the Y direction gap length Gy and the median value of the tolerable range by the predetermined coefficient smaller than 1. In this case, the correction of the offset W can be carried out by, for example, setting the predetermined coefficient to be ½, and changing the offsets Xw and Yw several times so that the both become gradually closer to the median values of the tolerable ranges, respectively.

According to this exemplary embodiment described above, since the offset Xw in the X direction and the offset Yw in the Y direction are respectively changed based on the average value Gxa of the X direction gap lengths $Gx_1$, $Gx_2$, and $Gx_3$ and the average value Gya of the Y direction gap lengths $Gy_1$, $Gy_2$, and $Gy_3$, it is advantageously possible to effectively correct the offset W with a smaller error, in addition to the same effects as the exemplary embodiments previously described.

The exemplary embodiment above is described taking the example in which the image of the pad group 70 including three pads whose designed gap lengths in the corresponding direction are the same is obtained, and then the X direction gap lengths $Gx_1$, $Gx_2$, and $Gx_3$ and the Y direction gap lengths $Gy_1$, $Gy_2$, and $Gy_3$ are obtained. However, as long as the designed gap lengths in the corresponding direction are the same, the plurality of X direction gap lengths Gx and the plurality Y direction gap lengths Gy can be sequentially obtained by sequentially obtaining a plurality of images of the of the pads, and then the offset W can be corrected based on the average values of these gap lengths. In this process, the X direction gap length Gx and the Y direction gap length Gy can be obtained based on the gaps respectively between two adjacent sides of each pad and the outline of the pressure-bonded ball.

Figure 13:
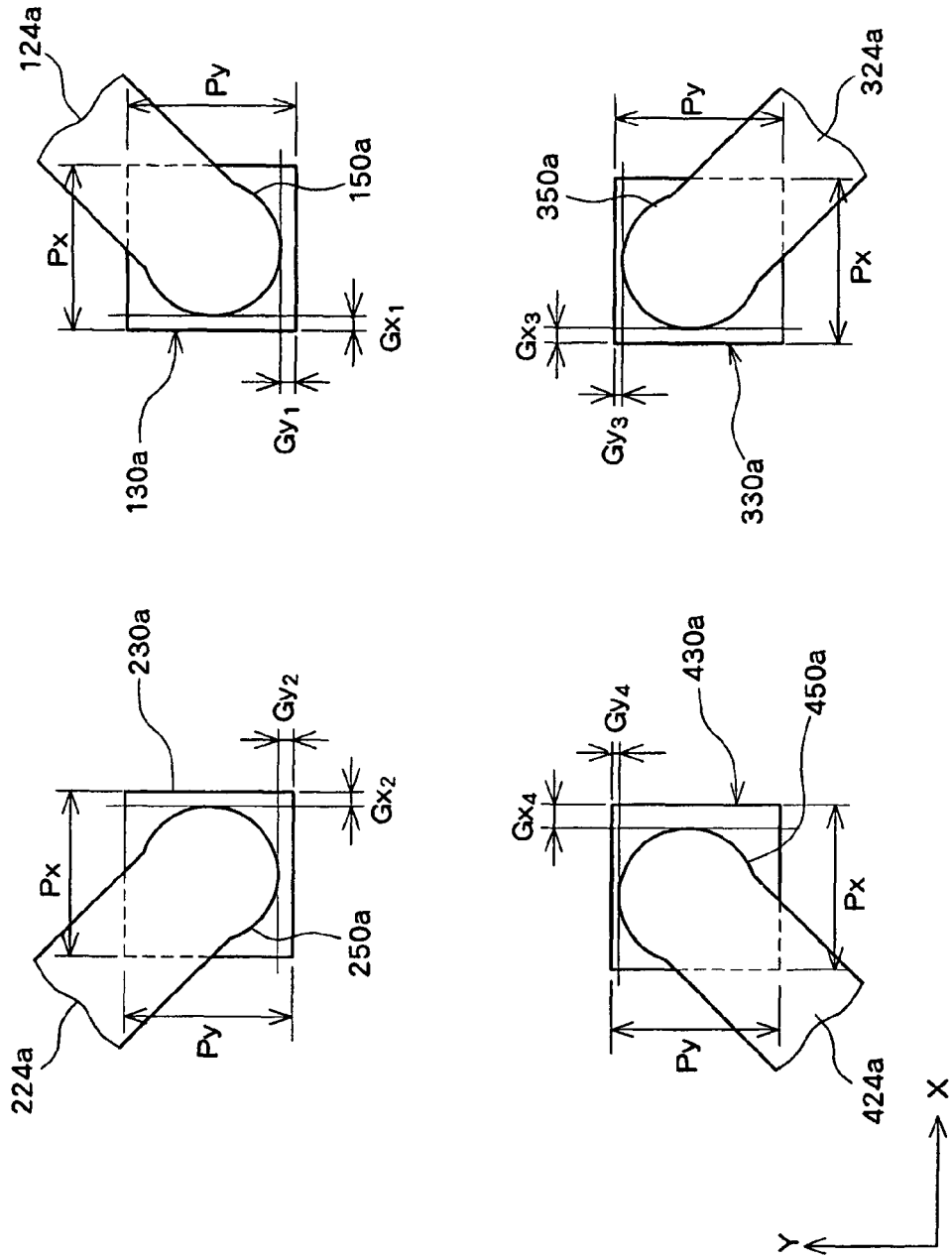
FIG. 13 is an illustrative diagram illustrating gap lengths between line segments of the sides of the pad and a curving line of the outline of the pressure-bonded ball acquired by processing an image acquired with the camera of the wire-bonding apparatus according to yet another exemplary embodiment of the present invention.

In this case, for example, when the X direction gap length Gx and the Y direction gap length Gy are obtained for each of the pads 130a, 230a, 330a, and 430a disposed at four corners of the semiconductor chip 23 shown in FIG. 2 each having the pad width Px in the X direction and the pad width Py in the Y direction, as shown in FIG. 13, it is possible to obtain the Y direction gap lengths $Gy_1$ and $Gy_2$ between the lower sides of the pads and the pressure-bonded ball, the Y direction gap lengths $Gy_3$ and $Gy_4$ between the upper sides of the pads and the pressure-bonded ball, the X direction gap lengths $Gx_1$ and $Gx_3$ between the left sides of the pads and the pressure-bonded ball, and the X direction gap lengths $Gx_2$ and $Gx_4$ the between right sides of the pads and the pressure-bonded ball, and the offset W can be corrected based on the average values of these gaps lengths. Therefore, it is advantageously possible to effectively correct the offset W with a smaller error, in addition to the same effects as the exemplary embodiments previously described.

Next, an operation of calculating and displaying the diameter of the pressure-bonded ball 50 in the wire-bonding apparatus 10 of this exemplary embodiment based on the X direction gap lengths $Gx_1$-$Gx_4$, the Y direction gap lengths $Gy_1$-$Gy_4$, and the pad width Pw when the pad width Px and the pad width Py shown in FIG. 10 and FIG. 13 take the same value of the pad width Pw will be described. The steps from the acquisition of the image to the acquisition of the X direction gap lengths $Gx_1$-$Gx_4$ and the Y direction gap lengths $Gy_1$-$Gy_4$ are carried out in the same manner as in the case of correcting the offset W as previously described. The pad width Pw is stored in the memory 63 of the control unit 60. The CPU 61 of the control unit 60 reads out the pad width Pw from the memory 63, and calculates the diameter of the pressure-bonded ball 50 by subtracting, from the pad width Pw, a value twice as large as the average value of the X direction gap lengths $Gx_1$-$Gx_4$, a value twice as large as the average value of the Y direction gap lengths $Gy_1$-$Gy_4$, or a value twice as large as an average value of the average values of both the X direction gap lengths $Gx_1$-$Gx_4$ and the Y direction gap lengths $Gy_1$-$Gy_4$. Since the pressure-bonded ball that is formed on a pad of a fine-pitch semiconductor chip as in this exemplary embodiment takes substantially a true circle, it is possible to obtain the diameter of the pressure-bonded ball 50 at an accuracy of a practical level by the method described above.

Upon completion of the calculation of the diameter of the pressure-bonded ball 50, the CPU 61 of the control unit 60 displays the diameter of the pressure-bonded ball 50 in the display unit 25 shown in FIG. 1.

As described above, according to the wire-bonding apparatus 10 of this exemplary embodiment, the diameter of the pressure-bonded ball 50 is calculated based on the average values of the gaps of the corresponding directions, and therefore it is advantageously possible to effectively calculate the diameter of the pressure-bonded ball 50 with a smaller error, in addition to the same effects as the exemplary embodiments previously described.

Figure 14:
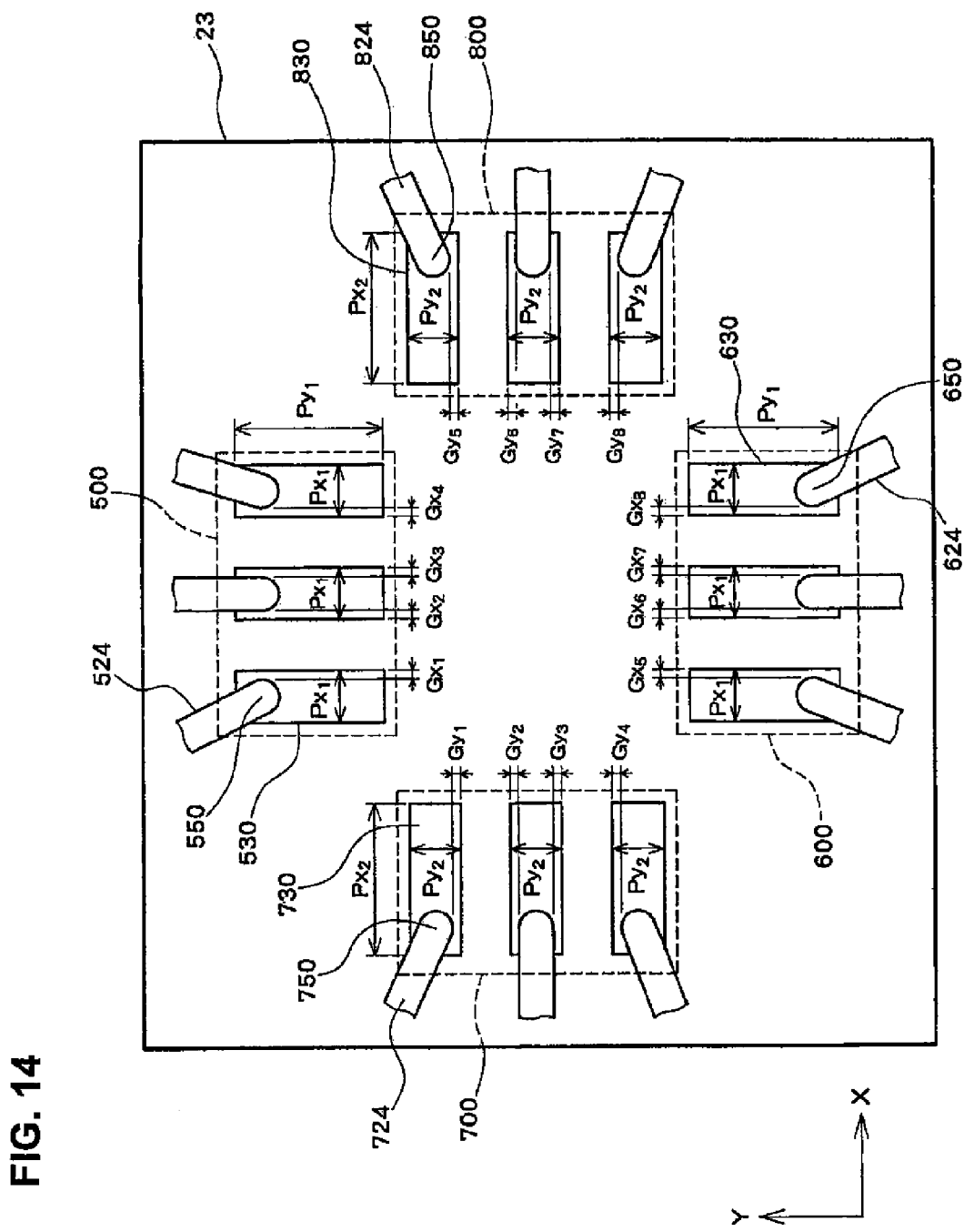
FIG. 14 is an illustrative diagram illustrating gaps between a pressure-bonded ball and a pad of a semiconductor device bonded by using the wire-bonding apparatus according to still another exemplary embodiment of the present invention.

Still another exemplary embodiment of the present invention will be described with reference to FIG. 14. According to this exemplary embodiment, the pads of the semiconductor chip 23 are in a rectangle shape. Referring to FIG. 14, the semiconductor chip 23 is provided with pads 530, 630, 730, and 830 in a rectangle shape. The pads 530 and 630 are in a vertically elongated shape, in which the width in the X direction is $Px_1$ and the width in the Y direction is $Py_1$, and the width $Py_1$ in the Y direction is greater than the width $Px_1$ in the X direction. Further, the pads 730 and 830 are in a horizontally elongated shape, in which the width in the X direction is $Px_2$ and the width in the Y direction is $Py_2$, and the width $Px_2$ in the X direction is greater than the width $Py_2$ in the Y direction. On the pads 530, 630, 730, and 830, pressure-bonded balls 550, 650, 750, and 850 are respectively formed each at a portion on the corresponding pad that is distant from the center of the semiconductor chip 23, and wires 524, 624, 724, and 824 extend respectively from the pressure-bonded balls 550, 650, 750, and 850 toward the outside of the semiconductor chip 23. Each of the pressure-bonded balls 550, 650, 750, and 850 has a diameter that is slightly smaller than the width $Px_1$ or $Py_2$ which is the smaller side of the corresponding pad. In addition, each of the pads 530 and 630 has the same designed X direction gap length for the pressure-bonded balls 550 and 650 that are respectively bonded to the pads 530 and 630, and each of the pads 730 and 830 has the same designed Y direction gap length for the pressure-bonded balls 750 and 850 that are respectively bonded to the pads 730 and 830.

In other words, the pad groups 500 and 600 include the three pads 530 and the three pads 630, respectively, having the same designed X direction gap length, and the pad groups 700 and 800 include the three pads 730 and the three pads 830, respectively, having the same designed Y direction gap length. The CPU 61 of the control unit 60 obtains the X direction gap length from the pad groups 500 and 600 and the Y direction gap length from the pad groups 700 and 800.

The CPU 61 of the control unit 60 acquires images of the pads 530 and 630 respectively included in the pad groups 500 and 600 and images of the pressure-bonded balls 550 and 650 respectively formed on the pads 530 and 630, and obtains the X direction gap lengths $Gx_1$-$Gx_8$ of each of the pads 530 and 630 similarly to the previously described exemplary embodiment. Further, the CPU 61 of the control unit 60 acquires images of the pads 730 and 830 respectively included in the pad groups 700 and 800 and images of the pressure-bonded balls 750 and 850 respectively formed on the pads 730 and 830, and obtains the Y direction gap lengths $Gy_1$-$Gy_8$ of each of the pads 730 and 830 similarly to the previously described exemplary embodiment. Then, similarly to the previously described exemplary embodiment, the CPU 61 of the control unit 60 shown in FIG. 1 compares the X direction gap lengths $Gx_1$-$Gx_8$ stored in the memory 63 respectively with the tolerable range of the X direction gap length stored in the memory 63. Here, it is possible to set the upper limit of the tolerable range to be a value obtained by adding the resolution length of the camera 16 to the corresponding designed gap length and set the lower limit of the tolerable range to be a value obtained by subtracting the resolution length of the camera 16 from the corresponding designed gap length. Alternatively, the upper limit can be a value obtained by adding the error tolerable in the bonding to the corresponding designed gap length, and the lower limit can be a value obtained by subtracting the error tolerable in the bonding from the designed gap length. In this case, the median value of the tolerable range corresponds to the designed gap length. The tolerable range can be constant, or can change depending on the semiconductor chip 23. Then, when one of the X direction gap lengths $Gx_1$-$Gx_8$ falls outside its tolerable range, the average value Gxa of the X direction gap lengths $Gx_1$-$Gx_8$ is calculated, and the X direction offset Xw is changed by the difference between the average value Gxa and the median value of the tolerable range of the X direction gap length. In addition, the Y direction gap lengths $Gy_1$-$Gy_8$ are compared with the tolerable ranges of the Y direction gap length stored in the memory 63, and when one of the Y direction gap lengths $Gy_1$-$Gy_8$ falls outside its tolerable range, the average value Gya of the Y direction gap lengths $Gy_1$-$Gy_8$ is calculated, and the Y direction offset Yw is changed by the difference between the average value Gya and the median value of the tolerable range of the Y direction gap length. Then, the CPU 61 of the control unit 60 changes the X direction offset Xw and the Y direction offset Yw, thereby correcting the offset W. Alternatively, the correction of the offset W can be carried out by changing the X direction offset Xw by the amount obtained by multiplying the difference between the X direction gap length Gx and the median value of the tolerable range by the predetermined coefficient smaller than 1, and changing the Y direction offset Yw by an amount obtained by multiplying the difference between the Y direction gap length Gy and the median value of the tolerable range by the predetermined coefficient smaller than 1. In this case, the correction of the offset W can be carried out by, for example, setting the predetermined coefficient to be ½, and changing the offsets Xw and Yw several times so that the both become gradually closer to the median values of the tolerable ranges, respectively.

According to this exemplary embodiment, the plurality of rectangle-shaped pads having the same designed gap length in the corresponding direction are categorized in the same pad group, and the gap lengths in the X direction and the Y direction are obtained from each group. Therefore, it is advantageously possible to effectively adjust the offset W even for the semiconductor chip 23 whose pads are not in a square shape, in addition to the same effects as the exemplary embodiments previously described.

Next, an operation of calculating and displaying the diameter of each pressure-bonded ball 50 in this exemplary embodiment will be described. The steps from the acquisition of the images to the acquisition of the X direction gap lengths $Gx_1$-$Gx_8$ and the Y direction gap lengths $Gy_1$-$Gy_8$ are carried out in the same manner as in the case of correcting the offset W as previously described. The pad widths $Px_1$ and $Py_2$ are both stored in the memory 63 of the control unit 60. As a design, when the pressure-bonded balls 550 and 650 are respectively bonded to the pads 530 and 630 each at the center in the X direction, the CPU 61 of the control unit 60 reads out the pad width $Px_1$ from the memory 63, and calculates the diameter of the pressure-bonded ball 50 by subtracting, from the pad width $Px_1$, a value twice as large as the average value of the X direction gap lengths $Gx_1$-$Gx_8$. Also as a design, when the pressure-bonded balls 750 and 850 are respectively bonded to the pads 730 and 830 each at the center in the Y direction, the CPU 61 of the control unit 60 reads out the pad width $Py_2$ from the memory 63, and calculates the diameter of the pressure-bonded ball 50 by subtracting, from the pad width $Py_2$, a value twice as large as the average value of the Y direction gap lengths $Gy_1$-$Gy_8$. Upon completion of the calculation of the diameter of the pressure-bonded ball 50, the CPU 61 of the control unit 60 displays the diameter of the pressure-bonded ball 50 in the display unit 25 shown in FIG. 1. Further, when the pad width $Px_1$ and the pad width $Py_2$ are equal, the CPU 61 of the control unit 60 can display the average value of the diameter of the pressure-bonded ball 50 calculated based on the X direction gap lengths $Gx_1$-$Gx_8$ and the diameter of the pressure-bonded ball 50 calculated based on the Y direction gap lengths $Gy_1$-$Gy_8$ as the diameter of the pressure-bonded ball 50 in the display unit 25.

Moreover, it is possible to obtain the diameters of the pressure-bonded balls 550 and 650 by averaging the X direction gap lengths $Gx_1$, $Gx_3$, $Gx_5$, and $Gx_7$ on the positive side with respect to the X direction of the pads 530 and 630 to calculate a positive X direction gap length Gxa+, averaging the X direction gap lengths $Gx_2$, $Gx_4$, $Gx_6$, and $Gx_8$ on the negative side with respect to the X direction of the pads 530 and 630 to calculate a negative X direction gap length Gxa−, and then subtracting the positive X direction gap length Gxa+ and the negative X direction gap length Gxa− from the pad width $Px_1$ in the X direction. Furthermore, it is possible to obtain the diameters of the pressure-bonded balls 750 and 850 by averaging the Y direction gap lengths $Gy_2$, $Gy_4$, $Gy_6$, and $Gy_8$ on the positive side with respect to the Y direction of the pads 730 and 830 to calculate a positive Y direction gap length Gya+, averaging the Y direction gap lengths $Gy_1$, $Gy_3$, $Gy_5$, and $Gy_7$ on the negative side with respect to the Y direction of the pads 730 and 830 to calculate a negative Y direction gap length Gya−, and then subtracting the positive Y direction gap length Gya+ and the negative Y direction gap length Gya− from pad width $Py_2$ in the Y direction. By calculating the diameter of the pressure-bonded ball based on the positive and negative gap lengths in this manner, it is possible to effectively calculate the diameter of the pressure-bonded ball, even when a pressure-bonded ball is not bonded at the center in the direction of the pad width as a design.

According to this exemplary embodiment, it is advantageously possible to effectively calculate the diameter of the pressure-bonded ball 50 even for the semiconductor chip 23 whose pads are not in a square shape, in addition to the same effects as the exemplary embodiments previously described.

Figure 15:
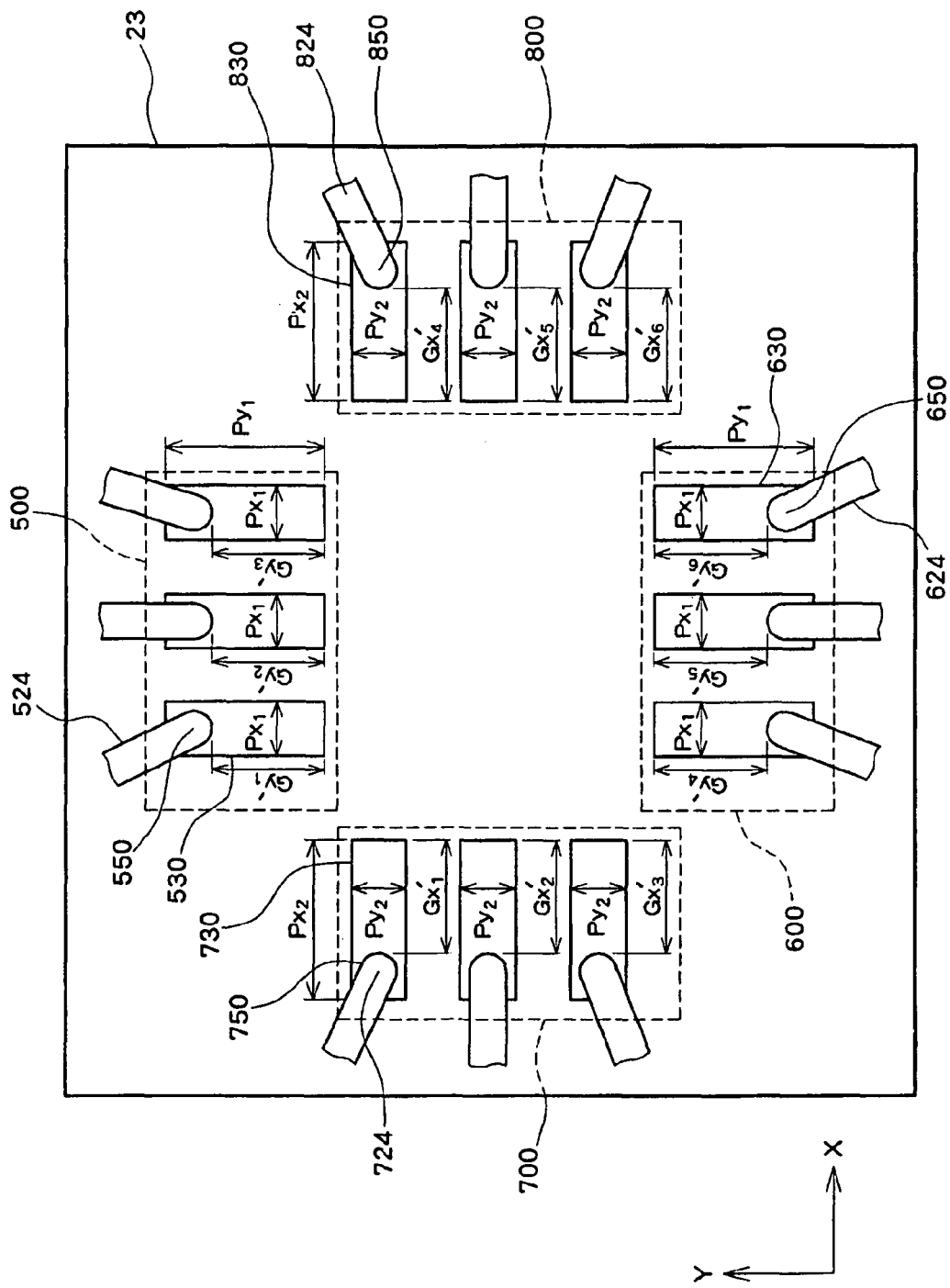
FIG. 15 is an illustrative diagram illustrating gaps between a pressure-bonded ball and a pad of a semiconductor device bonded by using the wire-bonding apparatus according to further another exemplary embodiment of the present invention.

Further exemplary embodiment will be described with reference to FIG. 15. This exemplary embodiment shows, in the semiconductor chip 23 having the same arrangement and the same size of the pads as in the exemplary embodiment shown in FIG. 14, the case in which the offset W is corrected by obtaining the Y direction gap length in the longitudinal direction of the rectangle-shaped pads 530 and 630, and the X direction gap length in the longitudinal direction of the pads 730 and 830. According to this exemplary embodiment, Y direction gap lengths $Gy_1'$-$Gy_3'$ of the pad 530 on the side closer to the center of the semiconductor chip 23 and Y direction gap lengths $Gy_4'$-$Gy_6'$ of the pad 630 on the side closer to the center of the semiconductor chip 23 are the same as a design, and X direction gap lengths $Gx_1'$-$Gx_3'$ of the pad 730 on the side closer to the center of the semiconductor chip 23 and X direction gap lengths $Gx_4'$-$Gx_6'$ of the pad 830 on the side closer to the center of the semiconductor chip 23 are the same as a design. In other words, the pad groups 500 and 600 include the three pads 530 and the three pads 630, respectively, having the same designed Y direction gap length, and the pad groups 700 and 800 include the three pads 730 and the three pads 830, respectively, having the same designed X direction gap length. The CPU 61 of the control unit 60 shown in FIG. 1 obtains the Y direction gap length from the pad groups 500 and 600 and the X direction gap length from the pad groups 700 and 800, by the same method as in the previous exemplary embodiments.

Further, similarly to the previously described exemplary embodiments, the CPU 61 of the control unit 60 shown in FIG. 1 compares each of the X direction gap lengths $Gx_1'$-$Gx_6'$ with the tolerable range of the X direction gap length, and when one of the X direction gap lengths $Gx_1'$-$Gx_6'$ falls outside its tolerable range, the average value Gxa of the X direction gap lengths $Gx_1'$-$Gx_6'$ is calculated, and the X direction offset Xw is changed by the difference between the average value Gxa and the median value of the tolerable range of the X direction gap length. Then, the CPU 61 of the control unit 60 shown in FIG. 1 compares the Y direction gap lengths $Gy_1'$-$Gy_6'$ with the tolerable range of the Y direction gap length, and when one of the Y direction gap lengths $Gy_1'$-$Gy_6'$ falls outside its tolerable range, the average value Gya of the Y direction gap lengths $Gy_1'$-$Gy_6'$ is calculated, and the Y direction offset Yw is changed by the difference between the average value Gya and the median value of the tolerable range of the Y direction gap length, thereby correcting the offset W.

According to this exemplary embodiment, similarly to the previously described exemplary embodiments, it is advantageously possible to effectively adjust the offset W even for the semiconductor chip 23 whose pads are not in a square shape.

The above exemplary embodiments describe the case in, which the present invention is applied to a wire-bonding apparatus. However, the present invention can be applied to any type of bonding apparatuses such as a bump bonding apparatus, in addition to a wire-bonding apparatus, as long as pressure-bonded balls are formed on pads of a semiconductor chip.

What is claimed is:

1. A bonding apparatus comprising:
   a bonding head movable in an X direction and a Y direction with an X-Y table;
   a bonding arm for moving a bonding tool in an approaching and retreating direction with respect to a pad of a semiconductor chip, the bonding arm being attached to the bonding head and having the bonding tool attached to a tip thereof;
   a camera for capturing an image of the pad and a bonded ball bonded to the pad, the camera being attached to the bonding head with an optical axis of the camera being offset by a predetermined distance in the X direction and the Y direction with respect to a center line of the bonding tool in bonding operation; and
   a control unit for controlling a position of a central axis of the bonding tool in the X direction and the Y direction based on an offset amount and the image of the pad captured with the camera,
   the control unit comprising:
   an outline obtaining means for obtaining each of sides of the pad in a quadrilateral shape and an outline of the bonded ball by processing the image captured with the camera;

a gap length obtaining means for obtaining each gap length between each of the sides of the pad and each portion of the outline of the bonded ball closest to corresponding sides of the pad; and an offset correcting means for correcting the offset amount based on each gap length obtained by the gap length obtaining means.

2. The bonding apparatus according to claim 1, wherein the outline obtaining means obtains each of sides of at least one pad in a quadrilateral shape and an outline of a bonded ball bonded to the at least one pad, wherein the gap length obtaining means obtains:

each distance in the Y direction, serving as each Y direction gap length, between each of the sides extending in the X direction of the at least one pad and each portion of the outline of the bonded ball closest to the corresponding sides extending in the X direction; and each distance in the X direction, serving as each X direction gap length, between each of the sides extending in the Y direction of the at least one pad and each portion of the outline of the bonded ball closest to the corresponding sides extending in the Y direction, and wherein the offset correcting means:

compares each X direction gap length and each Y direction gap length respectively with tolerable ranges previously set to determine whether or not each X direction gap length and each Y direction gap length fall within the tolerable ranges;

changes, when at least one of each X direction gap length is outside the tolerable range, an offset amount in the X direction according to a difference between each X direction gap length and a median value of the tolerable range; and changes, when at least one of each Y direction gap length is outside the tolerable range, an offset amount in the Y direction according to a difference between each Y direction gap length and a median value of the tolerable range.

3. The bonding apparatus according to claim 2, wherein the outline obtaining means obtains each of sides of a plurality of pads in a quadrilateral shape and an outline of a bonded ball bonded to each of the pads, the plurality of pads having an identical designed gap length, and wherein the offset correcting means changes the offset in the X direction according to a difference between an average value of each X direction gap length and the median value of the tolerable range, and changes the offset in the Y direction according to a difference between an average value of each Y direction gap length and the median value of the tolerable range.

4. The bonding apparatus according to claim 2, wherein the gap length obtaining means obtains one X direction gap length and one Y direction gap length for each pad.

5. The bonding apparatus according to claim 4, wherein the X direction gap length and the Y direction gap length are the distance in the X direction and the distance in the Y direction respectively between two adjacent sides and portions of the outline of the bonded ball closest to the corresponding sides.

6. The bonding apparatus according to claim 3, wherein the gap length obtaining means obtains:

each X direction gap length based on a distance in the X direction between each of the sides of the plurality of pads being in a quadrilateral shape included in a first group and having an identical designed gap length in the X direction, and each portion of the outline of each bonded ball closest to the corresponding sides extending in the Y direction, each of the bonded balls being bonded to each of the pads; and each Y direction gap length based on a distance in the Y direction between each of the sides of the plurality of pads being in a quadrilateral shape included in a second group and having an identical designed gap length in the Y direction, and each portion of the outline of each bonded ball closest to the corresponding sides extending in the X direction, each of the bonded balls being bonded to each of the pads.

7. The bonding apparatus according to claim 1, further comprising:

a bonded ball diameter calculating means for calculating a diameter of the bonded ball based on each gap length obtained by the gap length obtaining means and a width of the pad; and a display unit for displaying the diameter of the bonded ball that is calculated.

8. The bonding apparatus according to claim 7, wherein the outline obtaining means obtains each of sides of a plurality of pads in a quadrilateral shape and an outline of a bonded ball bonded to each of the pads, the plurality of pads having an identical pad width and an identical designed gap length, wherein the gap length obtaining means obtains:

each distance in the Y direction, serving as each Y direction gap length, between each of the sides extending in the X direction of each of the pads and each portion of the outline of the bonded ball closest to corresponding sides extending in the X direction; and each distance in the X direction, serving as each X direction gap length, between each of the sides extending in the Y direction of each of the pads and each portion of the outline of the bonded ball closest to corresponding sides extending in the Y direction, and wherein the bonded ball diameter calculating means calculates the diameter of the bonded ball by subtracting a value twice as large as an average value of one or both of the gap lengths in the X direction and in the Y direction from the pad width.

9. The bonding apparatus according to claim 7, wherein the outline obtaining means obtains each of sides of a plurality of pads in a quadrilateral shape and an outline of a bonded ball bonded to each of the pads, the plurality of pads having an identical pad width and an identical designed gap length, wherein the gap length obtaining means obtains:

a distance in a pad width direction between each of the sides on a positive side with respect to the pad width direction and extending perpendicularly to the pad width direction and each portion of the outline of the bonded ball closest to a corresponding side as a positive pad width direction gap length; and a distance in the pad width direction between each of the sides on a negative side with respect to the pad width direction and extending perpendicularly to the pad width direction and each portion of the outline of the bonded ball closest to a corresponding side as a negative pad width direction gap length, and wherein the bonded ball diameter calculating means calculates the diameter of the bonded ball by subtracting an average value of the positive pad width direction gap lengths and an average value of the negative pad width direction gap lengths from the pad width.

10. A method of bonding utilizing a bonding apparatus, the method comprising:
- a bonding apparatus providing step of providing a bonding apparatus comprising:
  - a bonding head movable in an X direction and a Y direction with an X-Y table;
  - a bonding arm for moving a bonding tool in an approaching and retreating direction with respect to a pad of a semiconductor chip, the bonding arm being attached to the bonding head and having the bonding tool attached to a tip thereof;
  - a camera for capturing an image of the pad and a bonded ball bonded to the pad, the camera being attached to the bonding head with an optical axis of the camera being offset by a predetermined distance in the X direction and the Y direction with respect to a center line of the bonding tool in bonding operation; and
  - a control unit for controlling a position of a central axis of the bonding tool in the X direction and the Y direction based on an offset amount and the image of the pad captured with the camera,
- an outline obtaining step of obtaining each of sides of the pad in a quadrilateral shape and an outline of the bonded ball by processing the image captured with the camera;
- a gap length obtaining step of obtaining each gap length between each of the sides of the pad and each portion of the outline of the bonded ball closest to corresponding sides of the pad; and
- an offset correcting step of correcting the offset amount based on each gap length obtained in the gap length obtaining step.

11. The method according to claim 10,
wherein, in the outline obtaining step, each of sides of at least one pad and an outline of a bonded ball bonded to the at least one pad are obtained,
wherein, in the gap length obtaining step,
each distance in the Y direction between each of the sides extending in the X direction of the at least one pad and a portion of the outline of the bonded ball closest to corresponding sides extending in the X direction is obtained serving as each Y direction gap length, and
each distance in the X direction between each of the sides extending in the Y direction of the at least one pad and each portion of the outline of the bonded ball closest to corresponding sides extending in the Y direction is obtained serving as each X direction gap length, and
wherein, in the offset correcting step,
each X direction gap length and each Y direction gap length are respectively compared with tolerable ranges previously set to determine whether or not each X direction gap length and each Y direction gap length fall within the tolerable ranges,
when at least one of each X direction gap length is outside the tolerable range, an offset amount in the X direction is changed according to a difference between each X direction gap length and a median value of the tolerable range, and
when at least one of each Y direction gap length is outside the tolerable range, an offset amount in the Y direction is changed according to a difference between each Y direction gap length and a median value of the tolerable range.

12. The method according to claim 11,
wherein, in the outline obtaining step, each of sides of a plurality of pads in a quadrilateral shape and an outline of a bonded ball bonded to each of the pads are, the plurality of pads having an identical designed gap length, and
wherein, in the offset correcting step,
the offset amount in the X direction is changed according to a difference between an average value of each X direction gap length and the median value of the tolerable range, and
the offset amount in the Y direction is changed according to a difference between an average value of each Y direction gap length and the median value of the tolerable range.

13. The method according to claim 12
wherein, in the gap length obtaining step,
each X direction gap length is obtained based on a distance in the X direction between
each of the sides of the plurality of pads in a quadrilateral shape included in a first group and having an identical designed gap length in the X direction, and
each portion of the outline of each bonded ball bonded to each of the pads closest to corresponding sides extending in the Y direction, and
each Y direction gap length is obtained based on a distance in the Y direction between
each of the sides of the plurality of pads in a quadrilateral shape included in a second group and having an identical designed gap length in the Y direction, and
each portion of the outline of each bonded ball bonded to each of the pads closest to corresponding sides extending in the X direction.

14. The bonding apparatus according to claim 3, wherein the gap length obtaining means obtains one X direction gap length and one Y direction gap length for each pad.

* * * * *